United States Patent
Nguyen et al.

(10) Patent No.: US 10,643,695 B1
(45) Date of Patent: May 5, 2020

(54) CONCURRENT MULTI-STATE PROGRAM VERIFY FOR NON-VOLATILE MEMORY

(71) Applicant: SanDisk Technologies LLC, Addison, TX (US)

(72) Inventors: Hao Nguyen, San Jose, CA (US); Chia-kai Chou, Newark, CA (US); Mohan Dunga, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/244,438

(22) Filed: Jan. 10, 2019

(51) Int. Cl.
| | |
|---|---|
| G11C 11/39 | (2006.01) |
| G11C 13/00 | (2006.01) |
| G11C 11/36 | (2006.01) |
| G11C 11/4074 | (2006.01) |
| G11C 11/4091 | (2006.01) |
| G11C 16/04 | (2006.01) |
| G11C 7/18 | (2006.01) |

(52) U.S. Cl.
CPC ............ *G11C 13/0064* (2013.01); *G11C 7/18* (2013.01); *G11C 11/36* (2013.01); *G11C 11/39* (2013.01); *G11C 11/4074* (2013.01); *G11C 11/4091* (2013.01); *G11C 13/0004* (2013.01); *G11C 16/0483* (2013.01); *G11C 2211/5614* (2013.01); *G11C 2213/71* (2013.01); *G11C 2216/28* (2013.01)

(58) Field of Classification Search
CPC .................................. G11C 11/39; G11C 7/12
USPC .................................................. 365/159, 203
See application file for complete search history.

(56) References Cited

U.S. PATENT DOCUMENTS

| | | |
|---|---|---|
| 4,397,022 A | 8/1983 | Weng et al. |
| 5,091,945 A | 2/1992 | Klejin |
| 5,206,866 A | 4/1993 | Tanagawa |
| 5,386,422 A | 1/1995 | Endoh |

(Continued)

FOREIGN PATENT DOCUMENTS

| | | |
|---|---|---|
| EP | 1137001 | 9/2001 |
| WO | WO2004/112040 | 12/2004 |

(Continued)

OTHER PUBLICATIONS

Notice of Allowance dated Mar. 19, 2019, U.S. Appl. No. 15/995,517, filed Jun. 1, 2018.

(Continued)

*Primary Examiner* — Michael T Tran
(74) *Attorney, Agent, or Firm* — Vierra Magen Marcus LLP

(57) ABSTRACT

A sense amplifier for a memory circuit that can sense into the deep negative voltage threshold region is described. A selected memory cell is sensed by discharging a source line through the memory cell into the bit line and sense amplifier. While discharging the source line through the memory cell into the sense amplifier, a voltage level on the discharge path is used to set the conductivity of a discharge transistor to a level corresponding to the conductivity of the selected memory cell. A sense node is then discharged through the discharge transistor. By allowing the sense amplifier to bias a memory cell being sensed to a selected one of multiple bias levels during a sensing operation, multiple target data states can be concurrently program verified, leading to higher performance when writing data.

19 Claims, 27 Drawing Sheets

(56) References Cited

U.S. PATENT DOCUMENTS

| | | | |
|---|---|---|---|
| 5,522,580 A | 6/1996 | Varner, Jr. | |
| 5,532,962 A | 7/1996 | Auclair et al. | |
| 5,570,315 A | 10/1996 | Tanaka | |
| 5,657,332 A | 8/1997 | Auclair et al. | |
| 5,657,354 A | 8/1997 | Thesling et al. | |
| 5,715,193 A | 2/1998 | Norman | |
| 5,719,808 A | 2/1998 | Harari | |
| 5,774,397 A | 6/1998 | Endoh | |
| 5,790,450 A * | 8/1998 | Nishizaka | G11C 17/126 365/104 |
| 5,822,225 A | 10/1998 | Quaderer et al. | |
| 5,920,501 A | 7/1999 | Norman | |
| 5,963,473 A | 10/1999 | Norman | |
| 6,023,783 A | 2/2000 | Divsalar et al. | |
| 6,031,760 A * | 2/2000 | Sakui | G11C 16/10 365/185.21 |
| 6,041,001 A | 3/2000 | Estakhri | |
| 6,046,935 A | 4/2000 | Takeuchi | |
| 6,209,113 B1 | 3/2001 | Roohparvar | |
| 6,222,762 B1 | 4/2001 | Guterman | |
| 6,226,200 B1 | 5/2001 | Eguchi et al. | |
| 6,279,133 B1 | 8/2001 | Vafai | |
| 6,456,528 B1 | 9/2002 | Chen | |
| 6,498,749 B1 | 12/2002 | Cuppens | |
| 6,516,455 B1 | 2/2003 | Teig et al. | |
| 6,522,580 B2 | 2/2003 | Chen | |
| 6,581,182 B1 | 6/2003 | Lee | |
| 6,621,739 B2 | 9/2003 | Gonzalez | |
| 6,638,317 B2 | 10/2003 | Nakao | |
| 6,671,852 B1 | 12/2003 | Ariel et al. | |
| 6,674,668 B2 | 1/2004 | Ikehashi et al. | |
| 6,850,441 B2 | 2/2005 | Mokhlesi | |
| 6,859,397 B2 | 2/2005 | Lutze | |
| 6,999,366 B2 | 2/2006 | Perner et al. | |
| 7,000,168 B2 | 2/2006 | Kurtas et al. | |
| 7,000,174 B2 | 2/2006 | Mantha et al. | |
| 7,010,064 B2 | 3/2006 | Penther | |
| 7,012,835 B2 | 3/2006 | Gonzalez | |
| 7,020,829 B2 | 3/2006 | Eroz | |
| 7,031,090 B2 | 4/2006 | Ichihara et al. | |
| 7,046,568 B2 | 5/2006 | Cernea | |
| 7,173,852 B2 | 2/2007 | Gorobets et al. | |
| 7,196,928 B2 | 3/2007 | Chen | |
| 7,224,607 B2 | 5/2007 | Gonzalez et al. | |
| 7,237,074 B2 | 6/2007 | Guterman et al. | |
| 7,237,181 B2 | 6/2007 | Richardson | |
| 7,333,364 B2 | 2/2008 | Yu et al. | |
| 7,447,079 B2 | 11/2008 | Nguyen et al. | |
| 7,518,919 B2 | 4/2009 | Gonzalez et al. | |
| 7,533,328 B2 | 5/2009 | Alrod et al. | |
| 7,555,070 B1 | 6/2009 | Ulriksson et al. | |
| 7,558,109 B2 | 7/2009 | Brandman et al. | |
| 7,600,177 B2 | 10/2009 | Qian et al. | |
| 7,688,617 B2 | 3/2010 | Sakimura et al. | |
| 7,710,674 B2 | 5/2010 | Esumi et al. | |
| 7,716,538 B2 | 5/2010 | Gonzalez et al. | |
| 7,886,204 B2 | 2/2011 | Gonzalez et al. | |
| 7,889,564 B2 * | 2/2011 | Joo | G11C 11/406 365/185.21 |
| 7,904,793 B2 | 3/2011 | Mokhlesi et al. | |
| 8,468,424 B2 | 6/2013 | Mokhlesi et al. | |
| 8,966,350 B2 | 2/2015 | Mokhlesi et al. | |
| 9,036,426 B2 | 5/2015 | Moschiano et al. | |
| 9,136,008 B1 * | 9/2015 | Yeh | G11C 16/26 |
| 9,548,130 B2 | 1/2017 | Dutta et al. | |
| 9,721,671 B2 | 8/2017 | Chu et al. | |
| 9,922,719 B2 | 3/2018 | Li et al. | |
| 10,217,519 B2 * | 2/2019 | Minagawa | G11C 16/08 |
| 10,304,550 B1 * | 5/2019 | Nguyen | G11C 16/3431 |
| 10,504,586 B2 * | 12/2019 | Shiino | G11C 11/5642 |
| 2003/0112901 A1 | 6/2003 | Gupta | |
| 2004/0005865 A1 | 1/2004 | Eroz | |
| 2004/0015771 A1 | 1/2004 | Lasser | |
| 2004/0057287 A1 | 3/2004 | Cernea | |
| 2004/0083334 A1 | 4/2004 | Chang | |
| 2004/0109357 A1 | 6/2004 | Cernea | |
| 2004/0255090 A1 | 12/2004 | Guterman | |
| 2005/0024939 A1 | 2/2005 | Chen | |
| 2006/0123318 A1 | 6/2006 | Kim | |
| 2006/0126390 A1 | 6/2006 | Gorobets | |
| 2006/0140007 A1 | 6/2006 | Cernea | |
| 2006/0158947 A1 | 7/2006 | Chan | |
| 2006/0178755 A1 | 8/2006 | Ling | |
| 2006/0190799 A1 | 8/2006 | Kan | |
| 2007/0104300 A1 | 5/2007 | Esumi et al. | |
| 2007/0104301 A1 | 5/2007 | Esumi et al. | |
| 2007/0110188 A1 | 5/2007 | Esumi et al. | |
| 2007/0124649 A1 | 5/2007 | Esumi et al. | |
| 2007/0171714 A1 | 7/2007 | Wu et al. | |
| 2007/0171730 A1 | 7/2007 | Ramamoorthy et al. | |
| 2008/0010581 A1 | 1/2008 | Alrod et al. | |
| 2008/0082897 A1 | 4/2008 | Brandman et al. | |
| 2008/0092014 A1 | 4/2008 | Brandman et al. | |
| 2008/0092015 A1 | 4/2008 | Brandman et al. | |
| 2008/0092026 A1 | 4/2008 | Brandman et al. | |
| 2008/0109702 A1 | 5/2008 | Brandman | |
| 2008/0109703 A1 | 5/2008 | Brandman | |
| 2008/0123420 A1 | 5/2008 | Brandman et al. | |
| 2008/0151617 A1 | 6/2008 | Alrod et al. | |
| 2008/0244338 A1 | 10/2008 | Mokhlesi et al. | |
| 2008/0244360 A1 | 10/2008 | Mokhlesi et al. | |
| 2008/0244367 A1 | 10/2008 | Chin et al. | |
| 2008/0244368 A1 | 10/2008 | Chin et al. | |
| 2008/0301523 A1 | 12/2008 | Eudes | |
| 2010/0202207 A1 | 8/2010 | Mokhlesi | |
| 2011/0176378 A1 * | 7/2011 | Chen | G11C 7/12 365/203 |
| 2011/0188317 A1 | 8/2011 | Mui et al. | |
| 2013/0286738 A1 | 10/2013 | Kamata | |
| 2014/0269094 A1 | 9/2014 | Maeda | |
| 2017/0062033 A1 | 3/2017 | Fujita | |
| 2017/0345492 A1 * | 11/2017 | Yoshimoto | G06F 3/0604 |
| 2018/0137900 A1 * | 5/2018 | Kim | G11C 16/24 |
| 2018/0247697 A1 * | 8/2018 | Lee | G11C 8/08 |
| 2019/0057747 A1 * | 2/2019 | Ho | G11C 16/26 |
| 2019/0287629 A1 * | 9/2019 | Bang | G11C 11/5642 |
| 2019/0295634 A1 * | 9/2019 | Hyodo | G06F 12/0246 |
| 2019/0295671 A1 * | 9/2019 | Bang | G11C 11/5642 |
| 2019/0305096 A1 * | 10/2019 | Choi | H01L 27/11582 |

FOREIGN PATENT DOCUMENTS

| | | |
|---|---|---|
| WO | WO2008/042593 | 4/2008 |
| WO | WO2009/145923 A1 | 12/2009 |

OTHER PUBLICATIONS

Sun, et al., "On the Use of Strong BCH Codes for Improving Multilevel NAND Flash Memory Storage Capacity," IEEE Workshop on Signal Processing Systems (SiPS): Design and Implementation, Oct. 2006, 5 pages.

D. Mackay, "Information Theory, Inference and Learning Algorithms," Cambridge University Press 2003, Chapter 47, 23 pages.

N. Shibata, et al., "A 70nm 16Gb 16-level-cell NAND Flash Memory," 2007 Symp. on VLSI Circuits Digest of Technical Papers, pp. 190-191, Jun. 14-16, 2007.

Y. Zhang, et al., "An Integrated Phase Change Memory Cell With Ge Nanowire Diode for Cross-Point Memory," 2007 Symp. on VLSI Circuits Digest of Technical Papers, pp. 98-99, Jun. 14-16, 2007.

Kang, D.H., et al., "Novel Heat Dissipating Cell Scheme for Improving a Reset Distribution in a 512M Phase-Change Random Access Memory (PRAM)," 2007 Symp. on VLSI Circuits Digest of Technical Papers, pp. 96-97, Jun. 14-16, 2007.

Tanaka, H., et al., "Bit Cost Scalable Technology With Punch and Plug Process for Ultra High Density Flash Memory," 2007 Symp. on VLSI Circuits Digest of Technical Papers, pp. 14-15, Jun. 14-16, 2007.

(56) References Cited

OTHER PUBLICATIONS

Sun, et al., "Multilevel Flash Memory on-chip Error Correction Based on Trellis Coded Modulation," IEEE International Symposium on Circuits and Systems, May 24, 2006, pp. 1443-1446.
U.S. Appl. No. 15/995,517, filed Jun. 1, 2018 by Nguyen et al.

\* cited by examiner

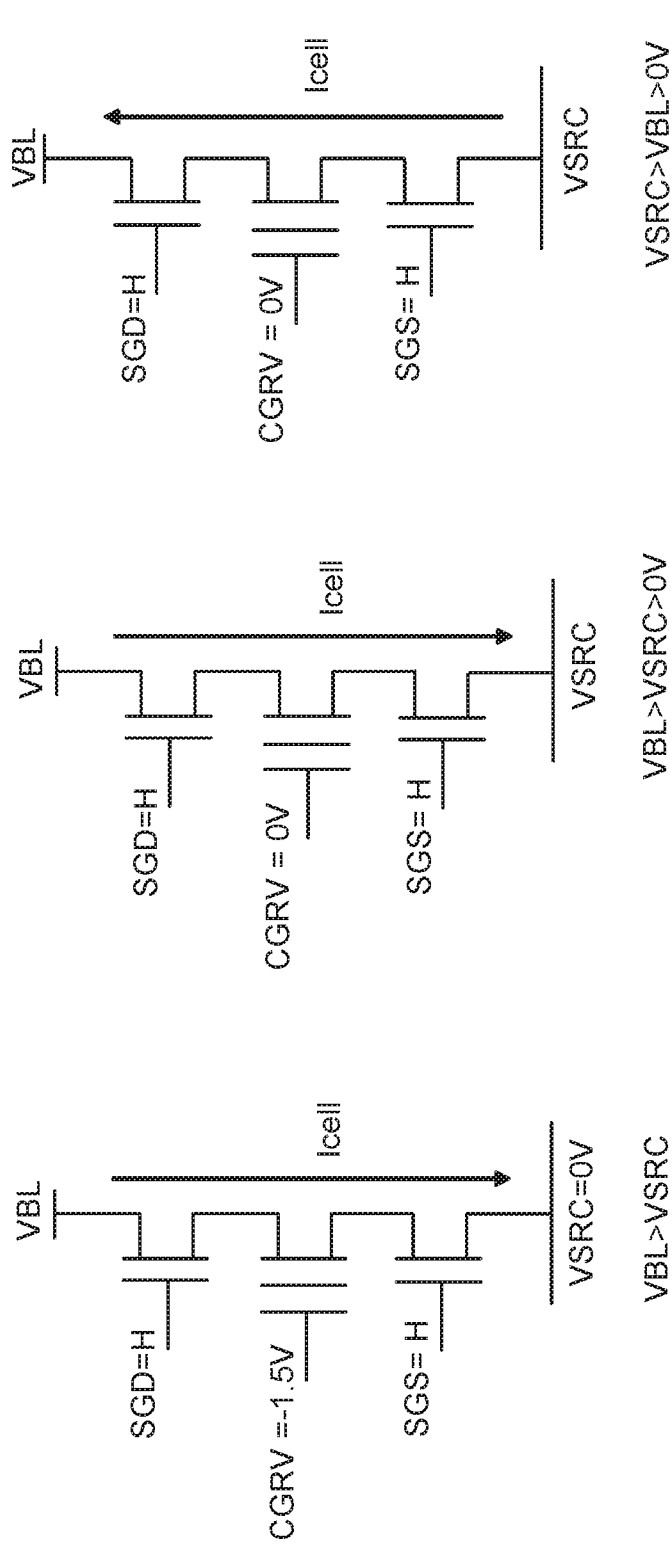

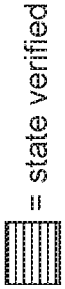

| | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

| | S1 | S2 | S3 | S4 | S5 | S6 | S7 | |
|---|---|---|---|---|---|---|---|---|
| Upper Page | | | VBLH | | | | VBLH | |
| Middle Page | | VBLL | | VBLL | | VBLL | | VBL |
| Lower Page | VBLH | | | | VBLH | | | |

US 10,643,695 B1

CONCURRENT MULTI-STATE PROGRAM VERIFY FOR NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIGS. 10A-10C illustrate several techniques for sensing memory cells with negative threshold voltage values.

FIG. 16A illustrates one embodiment for a smart verify algorithm for a 3-bit per cell embodiment.

FIG. 17A corresponds to FIG. 16A, but in an embodiment where two states can be verified at the same time.

DETAILED DESCRIPTION

Figure 1A:
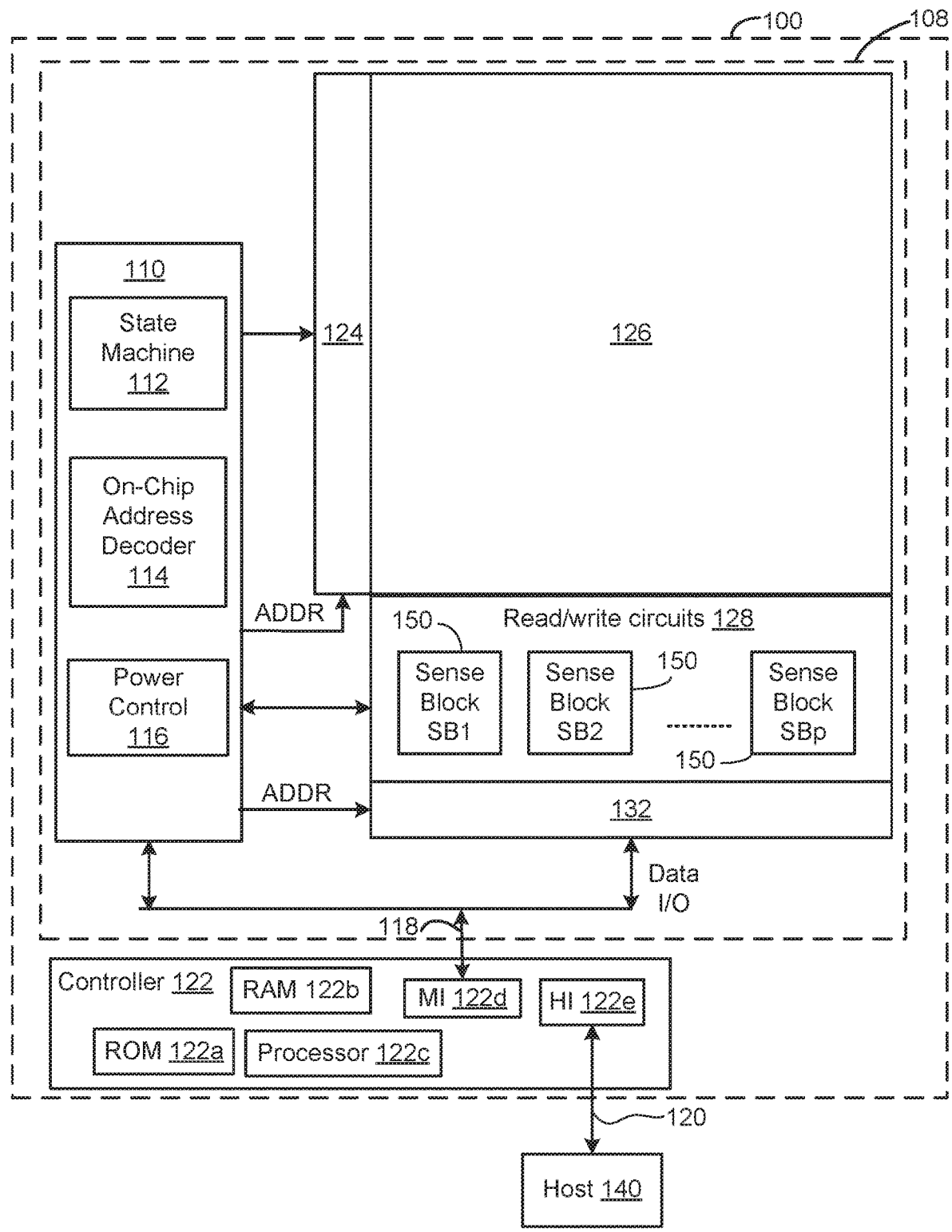
FIG. 1A is a functional block diagram of a memory device.

To increase the amount of data stored on a non-volatile memory device, data can be stored in a multi-level cell (MLC) format, where an individual memory cell can be programmed to multiple different data states, allowing each memory cell to hold more than one bit of data. In memory cells where different data states correspond to different threshold voltage (Vt) values, this involves splitting up the range, or window, of available Vt values into a number of ranges corresponding to the different data states. To store more states per cell, the Vt range allotted to each state needs to be made smaller, the size of the window increased, or both. The size of the Vt window can be increased by extending the window further into negative Vt values and having multiple states with negative, or non-positive, Vt values. However, for this to be useful, the memory device must be able to distinguish between different non-positive Vt states.

Sensing negative Vt states by most standard sensing techniques and sense amp structures has a number of limitations. In a typical sensing arrangement, the control gate of a memory cell is biased by a read voltage and a bit line connected to a sense amp is discharged through the memory cell to a source line, where the amount of discharge depends on the value of the read voltage relative to the memory cell's Vt. Under this usual arrangement, reading of negative Vt states uses negative read voltages; however, negative voltages are typically not available on a memory die and their introduction involves complications. Alternately, negative Vt states can be read by raising the source voltage, but this approach can usually only extend to a fairly shallow negative Vt range. To allow for sensing more deeply into the negative Vt range, the following introduces sense amp structures and techniques in which the source is discharged through a selected memory cell into the bit line and sense amp, reversing the usual direction of current flow through the selected memory cell in a sensing operation.

More specifically, a sense amplifier structure and sensing techniques are described where, in a first phase, the source line is discharged through a selected memory to the corresponding bit line and on into the sense amp. The amount of current discharged in this phase will depend on the conductivity of the memory cell, which in turn depends on the word line voltage supplied to the control gate of the selected memory cell relative to its threshold voltage. A discharge transistor has its control gate connected to the memory cell's discharge path during the first phase, so that the conductivity of the discharge transistor will reflect the conductivity of the selected memory cell. The control gate of the discharge transistor is then set to float at this level. In a second phase, a sense node is then discharged through the discharge transistor: as the conductivity of the discharge transistor reflects the conductivity of the selected memory cell, the rate at which the sense node discharges reflects the conductivity of the memory cell. After discharging the sense node for a sensing period, the level on the sense node is latched for the read result.

To improve accuracy of the sensing operation, elements can be included in the sense amplifier to reduce noise levels. To reduce noise on the control gate of the discharge transistor when transitioning between phases, a decoupling capacitor can be connected to the control gate. The capacitor can also be biased to adjust for operating conditions, such as temperature, and device processing variations. To reduce noise on the source node of the discharge transistor, an auxiliary keeper current can be supplied through the discharge transistor during the transition between phases and on into the sense node discharge phase.

To improve performance, the sense amplifier structure can be used during program verify operations to concurrently verify more than one data state along a selected word line. When sensing a selected memory cell by discharging a current from the source line though the selected memory cell and into a corresponding sense amplifier, by varying the voltage level biasing the bit line connecting the corresponding sense amplifier to the selected memory cell, different threshold voltage levels can be sensed concurrently for the same word line voltage. In some embodiments, the sense amplifier can selectively bias the bit lines to different levels during sensing operations, allowing different data states to be sensed for the same word line voltage. This approach can be applied to both data read and program verify operations. During a program verify operation, as the memory system knows the target data state to which the memory cells are being programmed, the sense amplifiers for the different memory cells can bias their bit lines for sensing different target data states, allowing multiple target states to verified concurrently.

FIGS. 1A-5 describe examples of memory systems that can be used to implement the technology proposed herein. FIG. 1A is a functional block diagram of an example memory system 100. In one embodiment, the components depicted in FIG. 1A are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The row decoder 124 can include the drivers and other elements to bias the word lines for the different memory operations. The read/write circuits 128 include multiple sense blocks 150 including SB1, SB2, . . . , SBp (sensing circuitry) and allow a page of memory cells to be read or programmed in parallel, where a page is the unit in which data is written and/or read. A physical page is the physical unit of a number of cells into which data can be concurrently written and/or read, and a logical page a corresponding logical unit of data written into a physical page. More detail on sense amplifier circuits that can be used in the sense blocks 150 including SB1, SB2, . . . , SBp is given below with respect to FIGS. 11-14.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a state machine 112, an on-chip address decoder 114, and a power control circuit 116. The state machine 112 provides die-level control of memory operations. In one embodiment, state machine 112 is programmable by software. In other embodiments, state machine 112 does not use software and is completely implemented in hardware (e.g., electrical circuits). In other embodiments, state machine 112 can be replaced by a programmable microcontroller. Control circuitry 110 also includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. Power control module 116 may include charge pumps for creating voltages. The sense blocks include bit line drivers.

Figure 2:
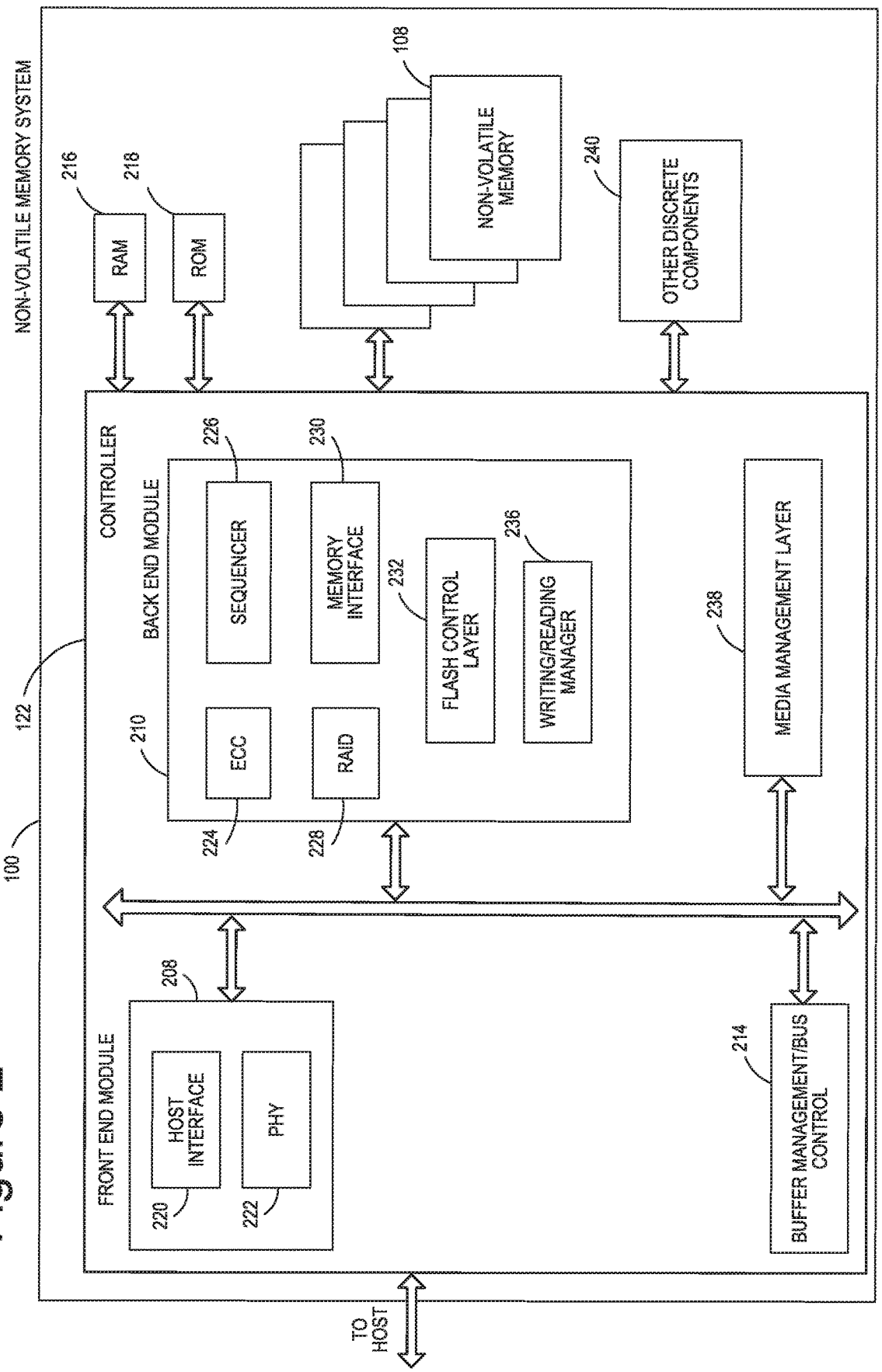
FIG. 2 is a block diagram depicting one embodiment of a memory system.

State machine 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, FGA, ASIC, integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two-dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits a unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
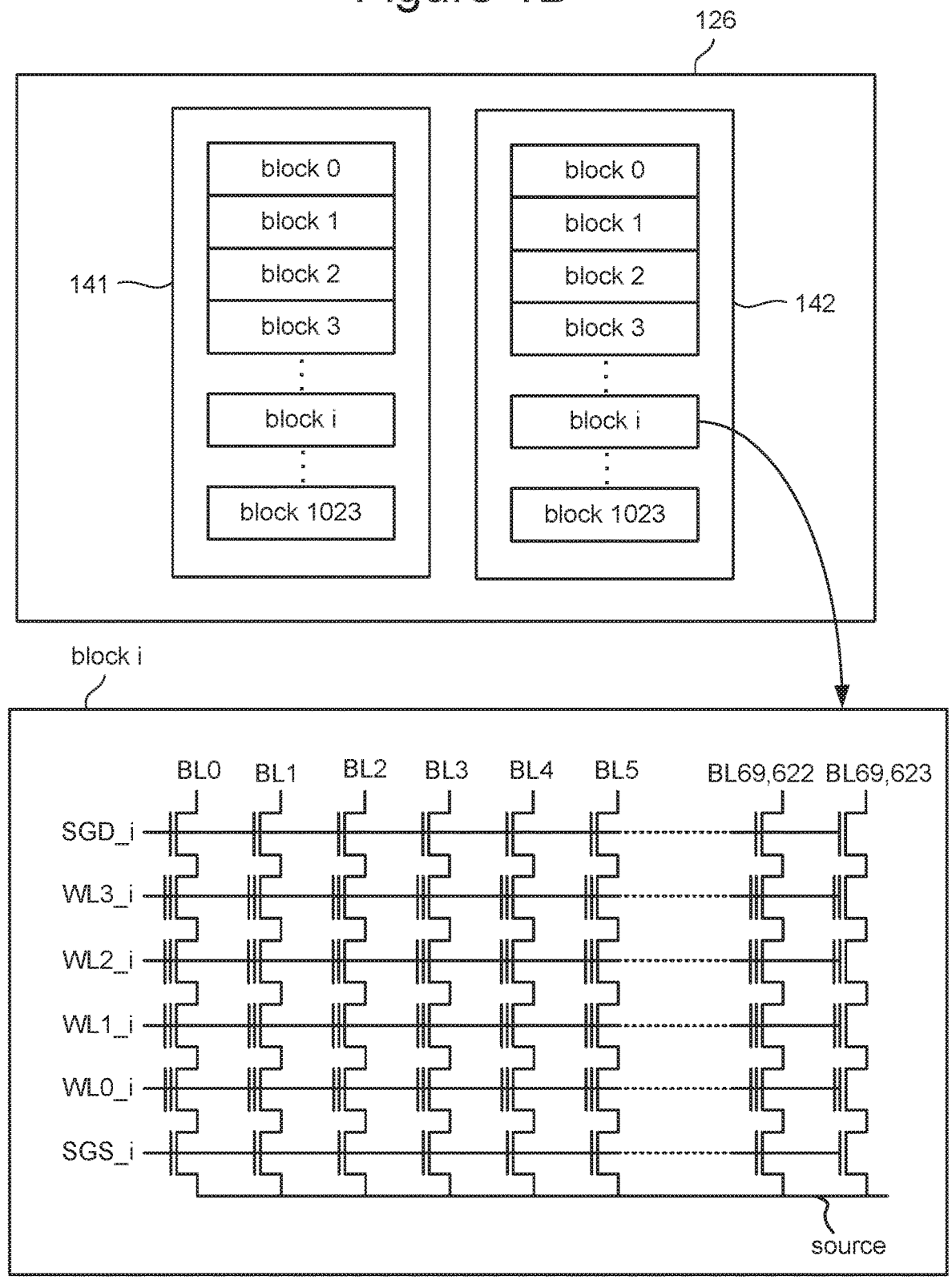
FIG. 1B is a block diagram depicting one example of a memory structure.

FIG. 1B depicts an example of memory structure 126. In one embodiment, an array of memory cells is divided into multiple planes. In the example of FIG. 1B, memory structure 126 is divided into two planes: plane 141 and plane 142. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1B includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1B shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1B shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 2 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid-state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front-end module 208 that interfaces with a host, a back-end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1A (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flow charts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126 of die 108. The MML 238 may be needed because: 1) the memory may have limited endurance; 2) the memory structure 126 may only be written in multiples of pages; and/or 3) the memory structure 126 may not be written unless it is erased as a block. The MML 238 understands these potential limitations of the memory structure 126 which may not be visible to the host. Accordingly, the MML 238 attempts to translate the writes from host into writes into the memory structure 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid-state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
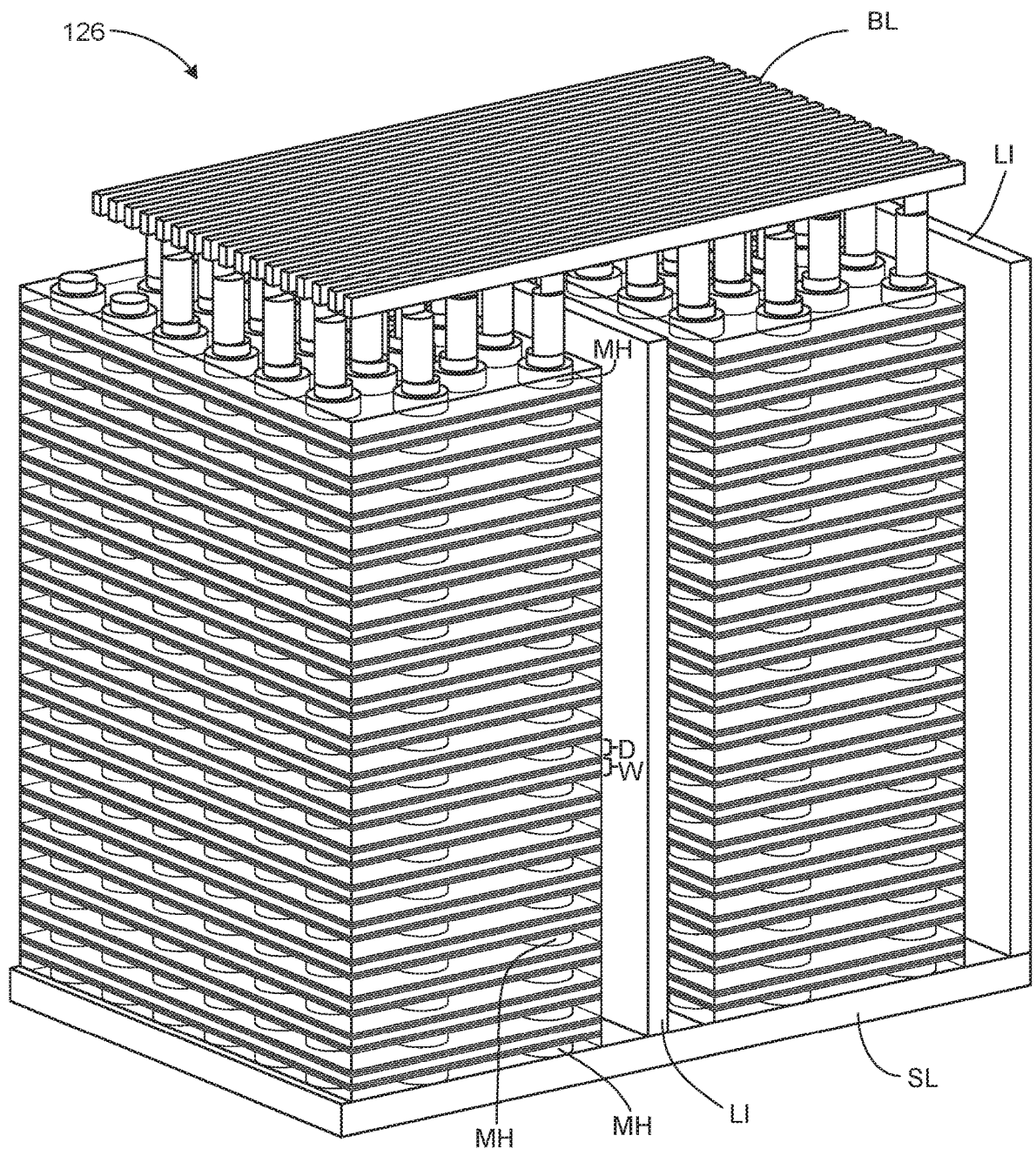
FIG. 3 is a perspective view of a portion of one embodiment of a monolithic three-dimensional memory structure.

FIG. 3 is a perspective view of a portion of one example embodiment of a monolithic three-dimensional memory structure 126, which includes a plurality memory of cells. For example, FIG. 3 shows a portion of one block of memory. The structure depicted includes a set of bit lines BL positioned above a stack of alternating dielectric layers and conductive layers. For example, purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI (isolation areas). FIG. 3 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided with respect to FIG. 4.

Figure 4:
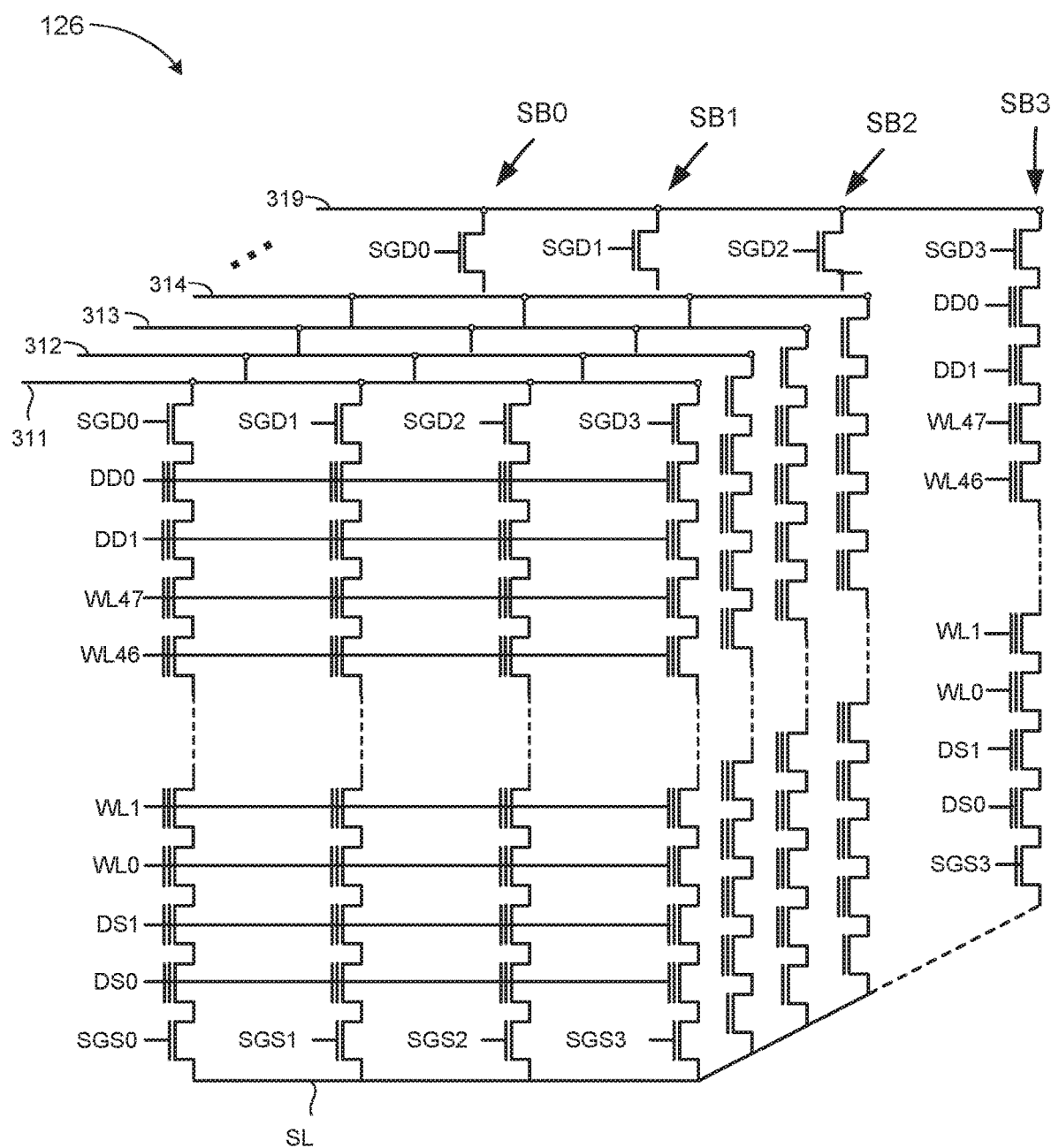
FIG. 4 is a schematic of a plurality of NAND strings.

FIG. 4 depicts an example 3D NAND structure and shows physical word lines WLL0-WLL47 running across the entire block. The structure of FIG. 4 can correspond to a portion of one of the blocks of FIG. 1B, including bit lines 311, 312, 313, 314, . . . , 319. Within the block, each bit line is connected to four NAND strings. Drain side selection lines SGD0, SGD1, SGD2 and SGD3 are used to determine which of the four NAND strings connect to the associated bit line. The block can also be thought of as being divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3. Note that FIG. 4 shows a single source line SL connected to all of the NAND strings and, therefore, all of the memory cells in the depicted circuit.

Figure 5:
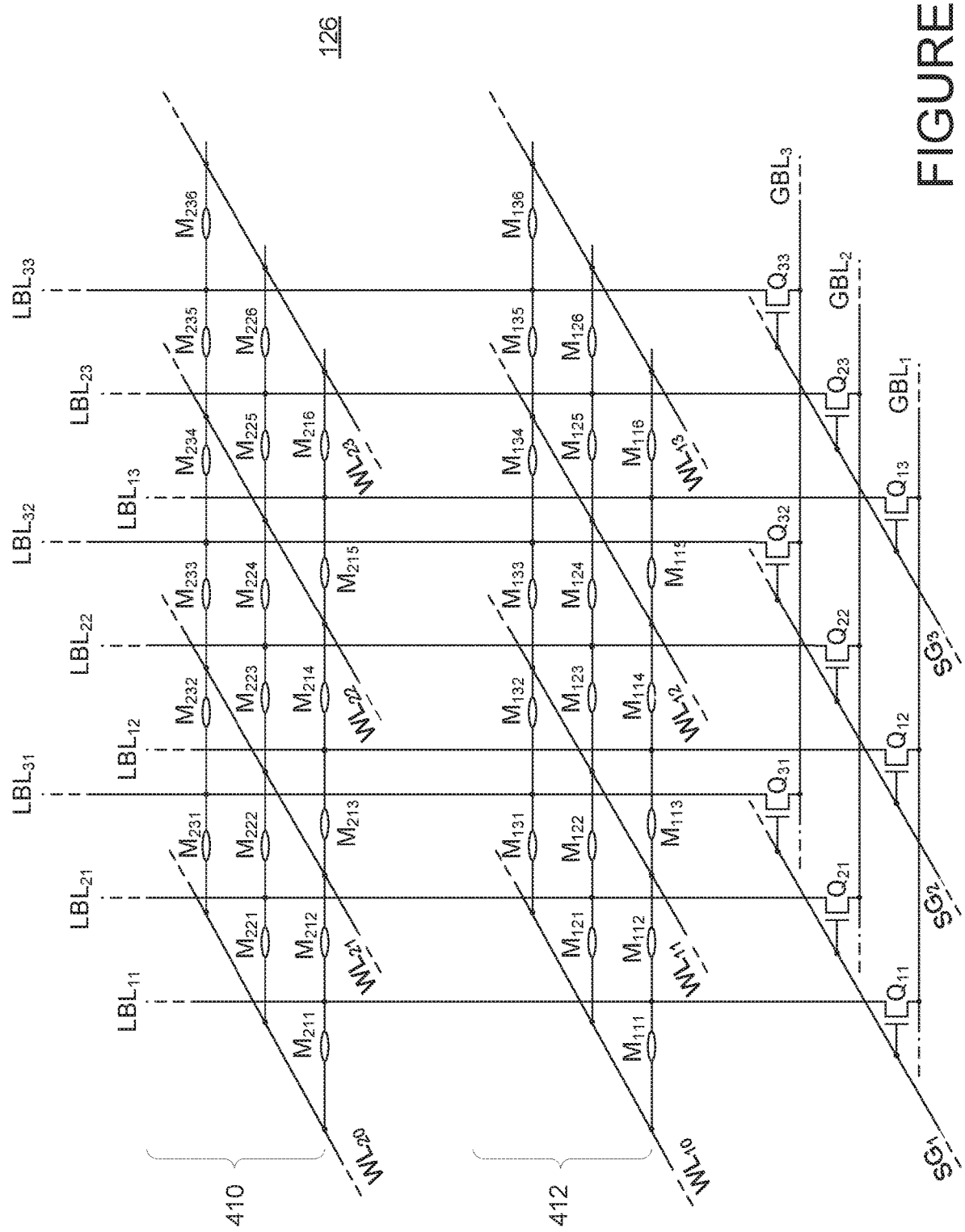
FIG. 5 depicts various embodiments of a portion of a three-dimensional memory array with a vertical cross-point structure.

FIG. 5 illustrates another memory structure that can be used for the structure 126 of FIG. 1A. FIG. 5 illustrates a three-dimensional vertical cross-point structure, the word lines still run horizontally, with the bit lines oriented to run in a vertical direction.

FIG. 5 depicts one embodiment of a portion of a monolithic three-dimensional memory array structure 126 that includes a first memory level 412 positioned below a second memory level 410. As depicted, the local bit lines LBL11-LBL33 are arranged in a first direction (i.e., a vertical direction) and the word lines WL10-WL23 are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$), such as a vertical thin film transistor (VTFT), may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 5, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 6:
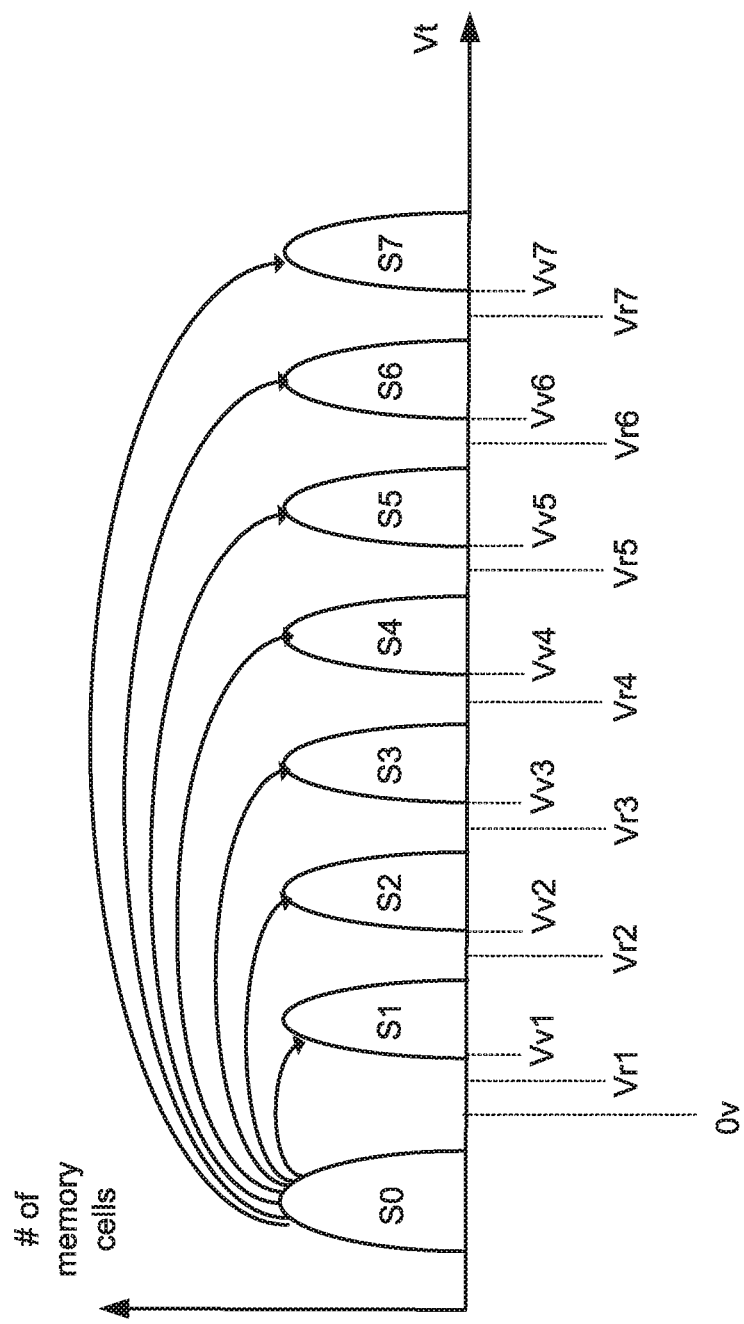
FIG. 6 depicts threshold voltage distributions in a three bit per cell embodiment.

The memory systems discussed above can be erased, programmed/written and read. At the end of a successful programming process, the threshold voltages of the memory cells should be within one or more distributions of threshold voltages for programmed memory cells or within a distribution of threshold voltages (Vts) for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
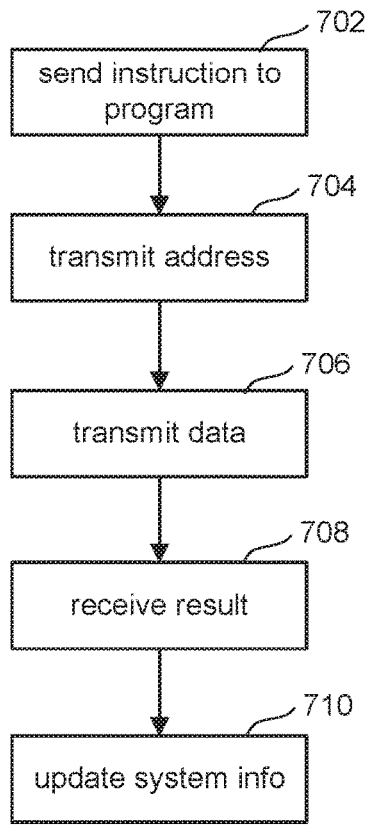
FIG. 7A is a flow chart describing one embodiment of a process for programming/writing.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller 122 (e.g., writing/reading manager 236) can also scramble the data prior to programming the data in the memory.

Figure 7B:
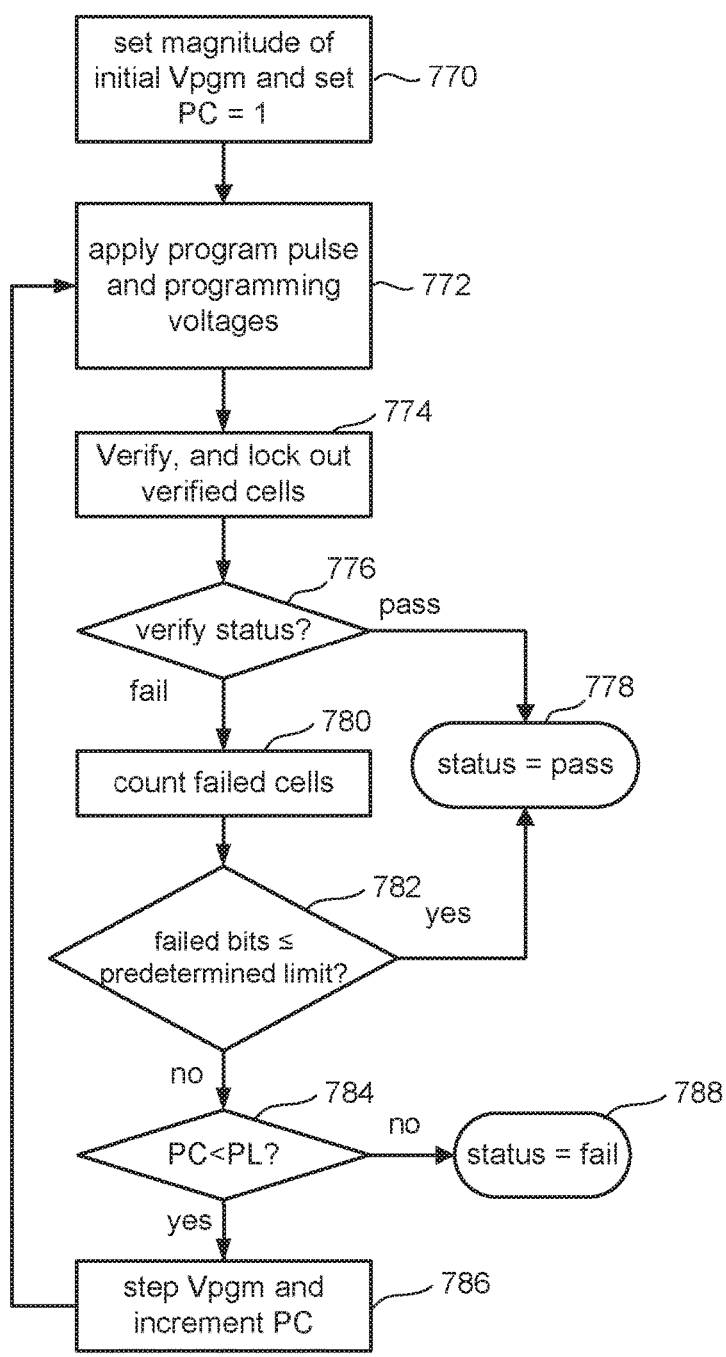
FIG. 7B is a flow chart describing one embodiment of a process for programming/writing data into memory cells connected to a common word line.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Figure 7C:
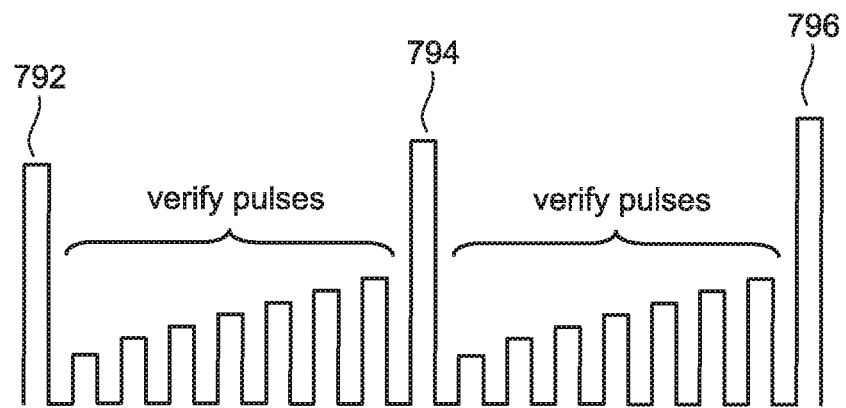
FIG. 7C depicts a word line voltage during programming/writing and verify operations.

Step 772 of FIG. 7B includes applying a program voltage pulse on the selected word line. Step 774 of FIG. 7B includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify reference voltages by applying the verify references voltages as verify pulses.

Figure 8:
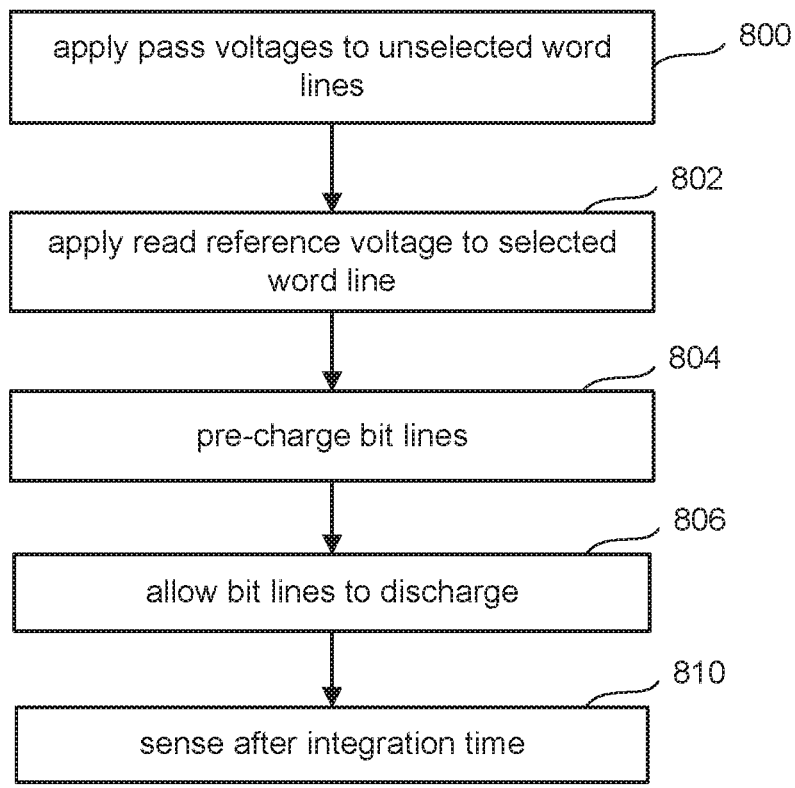
FIG. 8 is a flow chart describing one embodiment of a process for reading data from non-volatile memory cells.

FIG. 8 is a flow chart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0 v, or a small voltage near 0 v. In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 810. If the memory cell conducts in response to Vcgr, then the threshold voltage of the memory cell is less than Vcgr. If Vcgr=0 v and the memory cell turns on, then the memory cell is in the erased state and the data stored is 1. If Vcgr=0V and the memory cell does not turn on, then the memory cell is in the programmed state and the data stored is 0.

The storage density of a memory circuit such as in FIG. 1B, 3, 4, or 5 can be increased by storing more data states in each of the cells. For instance, FIG. 6 shows a 3-bit per cell example, where each memory cell can store one of 8 different data states. Storing 8 or even more states per cell presents a number of difficulties, as either the different state distributions need to be stored closer together, a larger range of threshold voltages (or "Vt window") needs to be used, or both. However, programming memory cell states more closely together becomes increasingly complicated, as obtaining sufficiently tight, well-separated distributions can significantly lower performance; and accurate data retention is harder as a smaller amount of threshold voltage drift can make reading the data difficult or even impossible. With respect to increasing the Vt window, going to higher threshold voltages allows for more states to be added at the high Vt end, but at the cost of increased operating voltages, increasing power consumption and possibly shortening device life. Alternately, the Vt window can be increased by extending it further into negative threshold voltages.

In the example of FIG. 6, only the distribution of the lowest, or erased, data state S0 has a threshold voltage below 0V. Storing more states with negative threshold values can increase the Vt window. This is illustrated in FIGS. 9A and 9B.

Figure 9A:
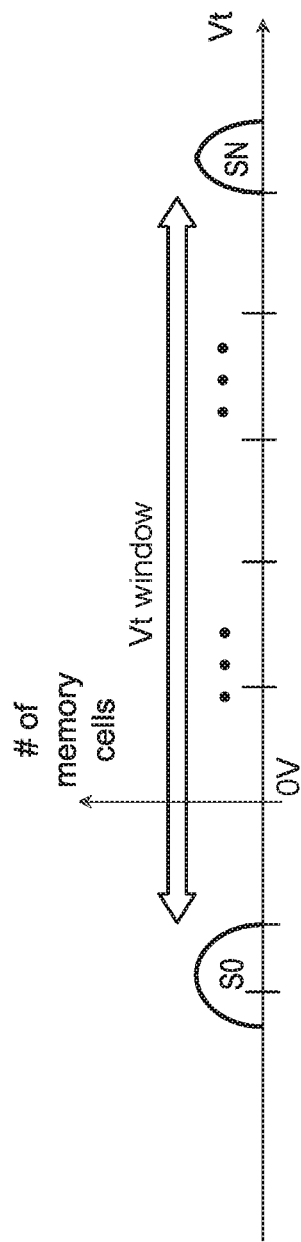
FIGS. 9A and 9B illustrate a window of threshold values to which memory cells can be programmed, including negative threshold values.
Figure 9B:
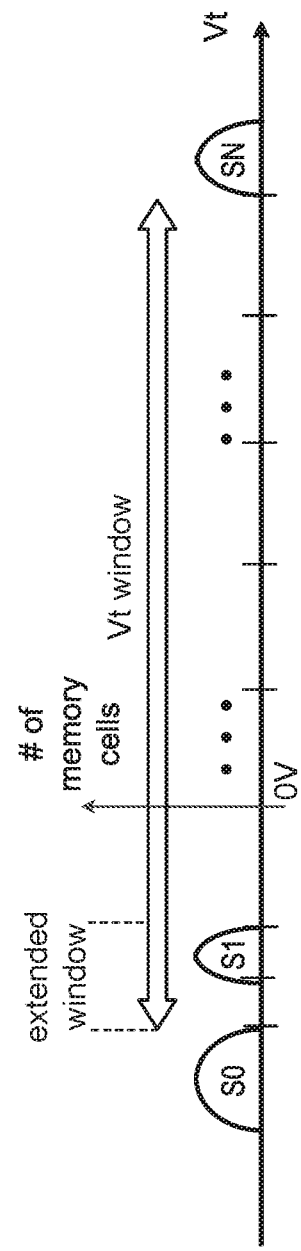

FIG. 9A is similar to FIG. 6, but only shows the lowest threshold data state S0 and the highest of threshold state SN. The effective Vt window in this example is from around −1V or a few tenths of a volt less on the low side to several volts on the high side (in the 4-6V range, for example, such as 5V), with the other state distributions falling in between these two values. If S0 is the only data state whose Vt is below 0V, this can be read by setting the control gate of the memory cell to ground at step 802 in the flow of FIG. 8. FIG. 9B illustrates lowering the bottom end of the Vt window deeper into negative Vt values. In this example, the data state S0's distribution is at or below Vt=−2.5V to −1.5V (e.g., around −2V or so), adding around 1V to the Vt window and providing additional room for more data states, such as illustrated by data state S1. However, distinguishing between different data states with negative thresholds has historically been difficult. Therefore, FIGS. 10A-10C present some techniques for sensing negative Vt values.

FIGS. 10A-10C are simplified representations showing a NAND string having only one memory cell connected in series between a source side select gate SGS and a drain side select gate SGD. To simplify the figures, other, non-selected memory cells of the NAND string are not shown but would be biased at a read pass voltage allowing them to conduct for any stored data states. The NAND string is connected on the source end to a source line SRC and on the drain side to a bit line, which is in turn connected to a sense amplifier.

FIG. 10A illustrates a sensing operation for the memory cell using a negative word line voltage CGRV to sense a negative threshold. Aside from the negative word line voltage, the NAND string is biased as is common for reading positive threshold voltage values on the gates of the memory cells. The drain and source select gates are set on by applying a sufficiently high voltage along the control lines to their gates, SGD=H and SGS=H, and the source line voltage VSRC is set to ground, VSRC=0V, or other low voltage. The bit line is pre-charged to positive voltage higher than VSRC; for example, VBL can be in the 0.2-1.0V ranges, such a 0.5V or somewhat lower. The bit line is then discharged by the current Icell, where the rate of discharge is based on the threshold voltage of the memory cell and the word line voltage CGRV on its control gate. After an integration time, the sense amp connected to bit line latches the result. Although this approach can be used for negative Vt states, it requires the use of negative voltages, such as the CGRV=−1.5V illustrated in FIG. 10A. However, negative voltages are typically not used on a memory device as they require additional circuitry to generate and are often difficult to maintain. Additionally, negative threshold voltage levels for the gates of the memory cells near or below the −1.5V range are difficult to produce, limiting how deeply the Vt window can be extended downward.

Another approach to sensing negative Vt states, but without negative threshold voltages for the gates of the memory cells, is illustrated in FIG. 10B. In FIG. 10B, the biasing of the NAND string is changed to allow a non-negative voltage, such as CGRV=0V, to be used to sense negative Vt states. The select gates (and any non-selected memory cells) of the NAND string are again biased to be on, but now the source line is raised above ground; for example, VSRC can be in the 0.8-1.5V ranges, such as about 1V or a little higher. This places the source of the selected memory cell at VSRC and allows for negative Vt sensing with a non-negative word line voltage. To discharge the bit line by Icell through the selected memory cell, the bit line is then pre-charged to a level above the source line; for example, VBL can be in the 1.2-1.8V range, such as around a volt and half, placing it a few tenths of a volt above VSRC. After discharging the bit line for a sensing interval, the result is then latched by the corresponding sense amp for the read result. Although this technique allows for negative Vt sensing without negative voltages, it cannot go much deeper into negative Vt values than about −1.1V.

FIG. 10C illustrates another approach that can extend sensing into deeper negative Vt values while only using non-negative voltages. In the sensing arrangement of FIG. 10C, the source line is raised to a voltage level above the bit line voltage level, VSRC>VBL>0V. Rather than determining whether a selected memory cell is conducting by discharging the bit line through the memory cell into the source line, the source line is now discharged through the memory cell into the bit line and sense amp. FIG. 10C illustrates this by the current Icell running upwards towards the bit line, rather than downwards toward the source line as in FIGS. 10A and 10B. For example, the source line can be set in the range VSRC=2.0-2.5V, such as a little over 2V, and the bit line voltage, VBL, set a few tenths (e.g., 0.2-0.4V) of a volt less. With CGRV=0V, this allows for sensing of a Vt down to about, for example, −1.8V or even further depending on the VSRC and VBL levels. The approach of FIG. 10C is utilized in the following sense amplifier embodiments that can be used for deep negative threshold voltage sensing and techniques for reducing the noise that can occur in such sensing operations.

Figure 11:
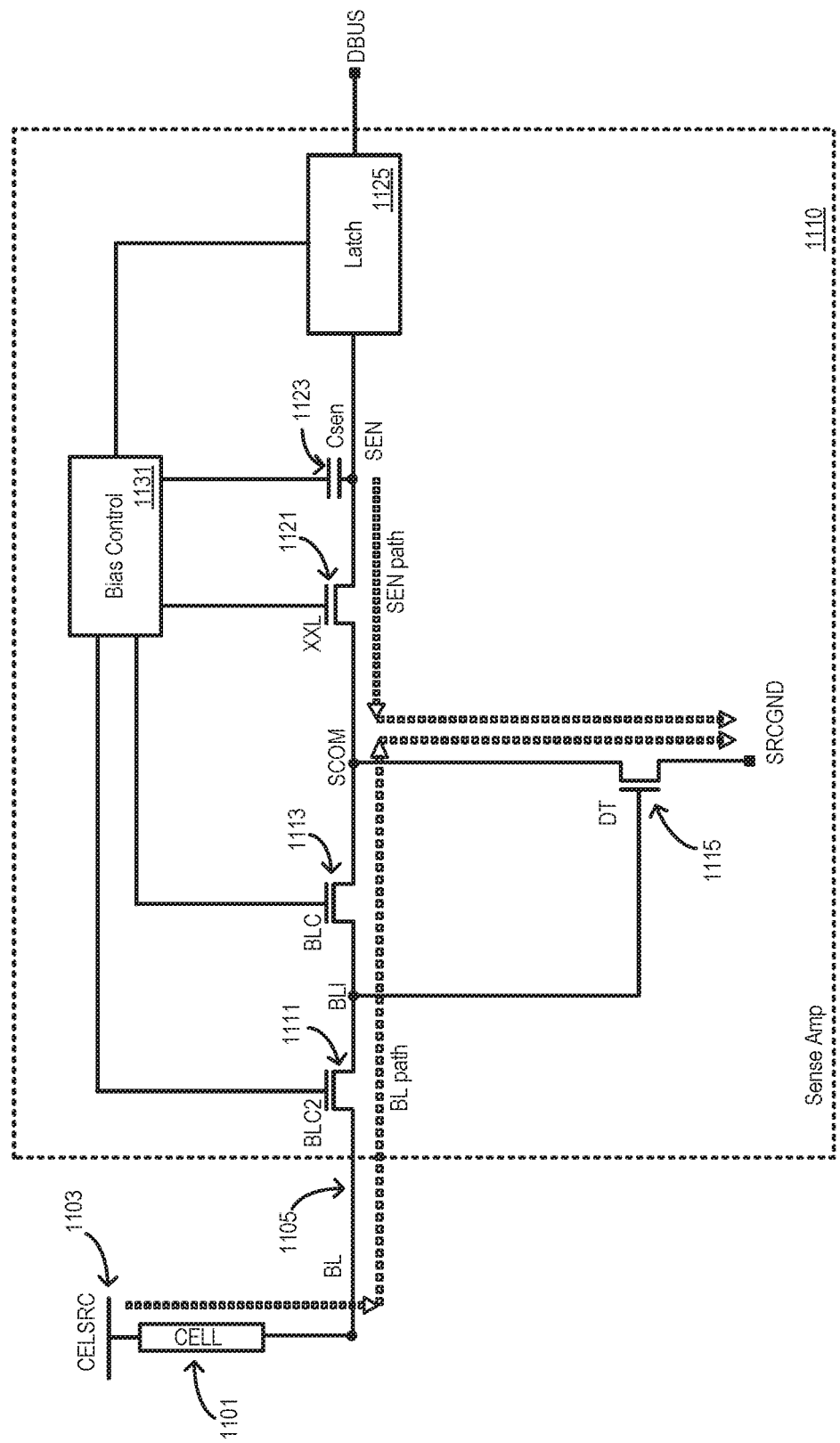
FIG. 11 illustrates some elements of an embodiment of a sense amplifier that can be used to perform a sensing operation using the techniques illustrated in FIG. 10C.

FIG. 11 illustrates an embodiment of a sense amplifier 1110 that can be used to perform a sensing operation using the approach of FIG. 10C. The sense amplifier 1110 can correspond to one of the sense blocks SB1, SB2, . . . , SBp 150 in FIG. 1A. A selected memory cell 1101 is connected between a source line CELSRC 1103 and a bit line BL 1105. Other memory cells (e.g. of same NAND string) are also connected between source line CELSRC 1103 and bit line BL 1105; however, those other memory cells are not depicted in FIG. 11. The sense amplifier 1110 is typically selectively connectable to multiple bit lines through column decoding circuit not shown in FIG. 11. The selected bit line BL 1105 can be discharged on the path labelled "BL path" through the series connected switches BLC2 1111 and BLC 1113 to the discharge transistor DT 1115, and then on through the discharge transistor DT 1115 to the discharge node SRCGND. The control gate of the discharge transistor DT 1115 is connected in a diode type arrangement to the internal (to the sense amp) bit line node BLI between BLC2 1111 and BLC 1113. When both of BLC2 1111 and BLC 1113 are on, the current flowing to the bit line BL 1105 from the memory cell 1101 can discharge along the BL path to the discharge node SRCGND; and when both of BLC2 1111 and BLC 1113 are turned off, the discharge BL path is cut off and the control gate of DT 1115 is left to float at the level on the node BLI between BLC2 1111 and BLC 1113.

To the right in FIG. 11, a second discharge path labelled "SEN path" allows for the sensing node SEN to also discharge through the switch XXL 1121 to the discharge transistor DT 1115. When XXL 1121 is on, any charge stored on the capacitor Csen 1123 will discharge at a rate determined by the control gate voltage on discharge transistor DT 1115. After discharging over a sensing period, a sensing result based on the level on the node SEN can then be set in the latch 1125 and the shifted out over the data bus DBUS. The SEN node can be pre-charge by the latch 1125.

The voltage levels and timing for the switches in FIG. 11 are controlled by the elements on the memory array such as the read/write circuits 128 and sense blocks SB1, SB2, . . . , SBp 150 in FIG. 1A, here represented by the bias circuitry of control block 1131. A sensing operation, such as a read or verify, is done in two stages. After the initial biasing of the source line SRC, bit line BL, the selected memory and other elements (such as select gates and non-selected memory cells in a NAND embodiment), the switches BLC2 1111 and BLC 1113 are turned on and the bit line is discharged along the BL path through the discharge transistor. The degree of discharge, or whether there is any current discharged at all, will depend on the word line voltage CGRV on the selected memory cell's control gate and the selected memory cell's threshold voltage Vt. Consequently, the voltage on the node BLI will depend on the memory cell's data state and how this data state corresponds to the read level CGRV biasing the selected memory cell. After the voltage level on the node BLI is sufficiently stabilized, the switches BLC2 1111 and BLC 1113 are turned off, leaving the node BLI, and consequently the control gate of the discharge transistor DT 1115, to float at the level set during the bit line discharge phase.

Once the switches BLC2 1111 and BLC 1113 are turned off and the gate of the discharge transistor DT 1115 is floating at the level set during the bit line discharge phase, the conductivity of the transistor DT 1115 is based on the conductivity of the selected memory cell. In the sense node discharging phase, the switch XXL 1121 is turned on so that the previously charged sense node SEN and the sense node capacitor Csen 1123 can discharge through discharge transistor DT 1115 along the SEN path. After a discharge time, the value at the SEN node can then be captured by latch 1125. As the discharge rate along the SEN path depends on the gate voltage on the discharge transistor DT 1115, which in turn depends on the state of the selected memory cell, the latched value corresponds to the data state. For a memory cell biased as illustrated in FIG. 10C, VCGR=0V is used for sensing the lowest (i.e., most negative) data state, with the VCGR value increased to sense higher Vg states, both less negative Vt states and positive Vt states.

A number of variations in FIG. 11 are possible. For example, rather than having switches BLC2 1111 and BLC 1113 connected in series between BL 1105 and the central SCOM node as shown, one of these can be moved to between the node BLI and the gate of the discharge transistor DT 1115. This arrangement will also allow the level on the control gate of discharge transistor DT 1115 to be set by the voltage level on the BLI node when both switches are on; and close off the BL path and leave the control gate on discharge transistor DT 1115 to float when both are turned off. In another variation, the BL path and the SEN path could discharge through different transistors, but where the gates on both are tied together. These and other variations can be incorporated in the embodiment of FIG. 11 and other embodiments described below.

To more accurately sense data values, noise during the sensing process should be minimized to the extent practical, particularly when larger number of states are to be stored within the available Vt window. To this end, several techniques can be applied to the sense amp embodiments illustrated in FIG. 11 to provide improved product reliability and performance. Two sources of noise relate to the discharge transistor DT 1115 of FIG. 11, where noise on either the gate of the transistor, or, equivalently node BLI, and noise along the current paths through the transistor can throw off the sensing process.

To reduce noise on the current path through discharge transistor DT 1115, a clamp device and an auxiliary current source, or "keeper current," can be introduced into the sense amp circuit to clamp the drain voltage of the discharge transistor DT 1115 during sensing. This can help block the possible noise through discharge transistor DT 1115 and provide a current flow through discharge transistor DT 1115 to the node SRCGND. The node SRCGND will typically be a node on a commonly regulated SRCGND line to which the sense amp and other sense amps are connected, so that during a sensing operation all of the connected sense amps may be discharging current into the SRCGND line. The introduction of the auxiliary keeper current helps to remove the critical noise at SRCGND node during sensing.

To reduce noise at the control gate of the discharge transistor DT 1115, a de-coupling capacitor can be introduced to compensate and correct the possible coupling when the switches BLC2 1111 and BLC 1113 switch off to prepare for discharge of sense node. This solution will help to correct the possibly unwanted coupling to the gate of the discharge transistor DT 1115 and provides a more accurate sensing result. The de-coupling capacitor can track operating conditions, such as the temperature, and device corners in order to obtain more accurate sensing results. This can be useful to provide accurate sensing results with temperature dependence and device corners, since the level of how negative a Vt can be sensed may depend on the temperature and device corners.

Figure 12:
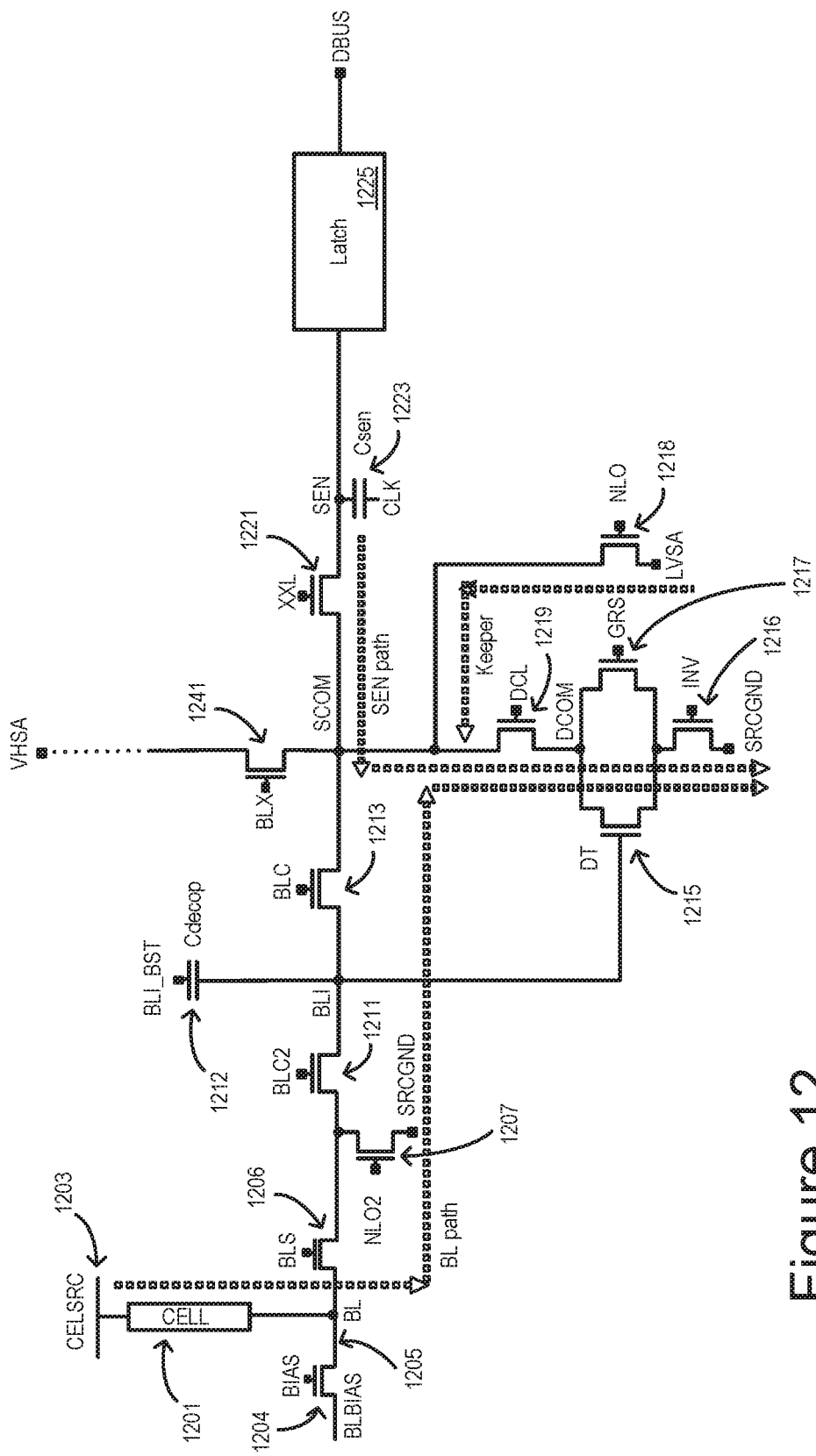
FIG. 12 is a more detailed representation of an embodiment for the sense amplifier of FIG. 11.

FIG. 12 includes these immediately above-described elements to reduce noise, as well as other elements that can be incorporated into various embodiments for a sense amp circuit, such as can be incorporated in the sense blocks SB1, SB2, . . . , SBp 150 of FIG. 1A. In FIG. 12, the elements of FIG. 11 are repeated along with a decoupling capacitor Cdecop 1212 connected to the node BLI and a supplemental current source NLO 1218 to help stabilize the SRCGND node during transition to the sensing phase.

More explicitly, FIG. 12 illustrates a memory cell 1201 connected between a source line CELSRC 1203 and a bit line BL 1205. The memory cell 1201 can be part of a NAND string of charge storing memory cells, such as described with respect to FIGS. 3 and 4, a memory cell based on a phase change memory material (PCM), such as described above with respect to FIG. 5, or of other memory technology. The bit line BL 1205 is connected to the sense amplifier through the decoding circuitry, here represented by the bit line select (BLS) switch 1206. (In this and following discussions, the switches are generally named according to their control signals from the bias control circuit, such that, for example, the control signal BLS for switch 1206 is also used for its name.)

After the bit line select switch BLS 1206, the bit line BL 1205 is connected to the internal bit line BLI through switch BLC2 1211, and then through switch BLC 1213 to the central common sensing node SCOM. The node SCOM is connected through the discharge transistor DT 1215 to allow the node SCOM to discharge to SRCGND. Similar to FIG. 11, this provides the discharge path labelled BL path from CELSRC 1203 through the selected memory cell 1201 to the selected bit line, on through the series connected switches BLC2 1211 and BLC 1213 to the discharge transistor DT 1215, and finally on to SRCGND. The control gate of DT 1215 is again connected to the node at BLI, so that when the switches BLC2 1211 and BLC 1213 are turned off, the control gate of DT 1215 will be left floating at the level on BLI.

Figure 13:
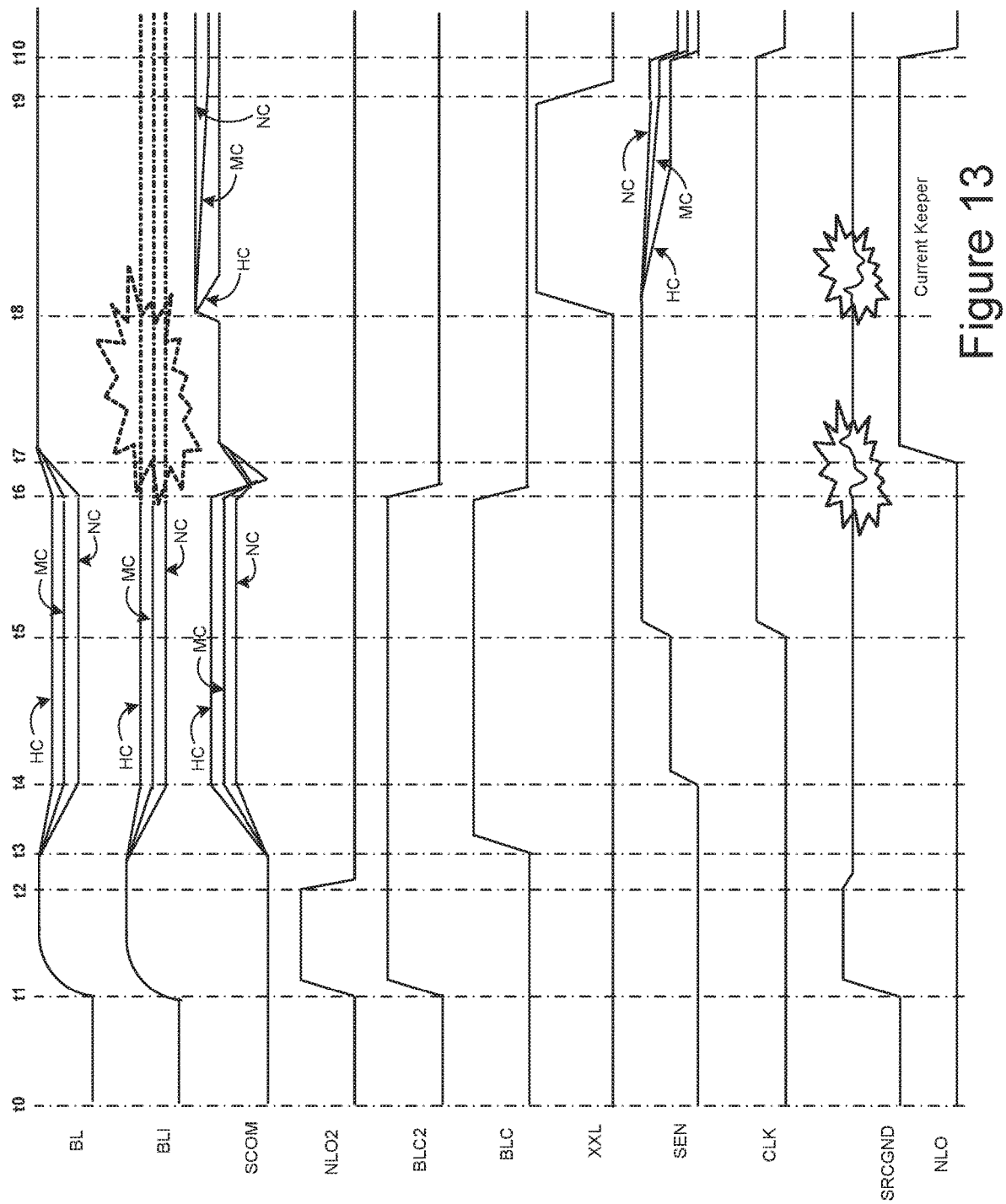
FIG. 13 illustrates one embodiment for some of the control waveforms for a sensing operation using the embodiment of FIG. 12.

To the right on FIG. 12, the SEN node with the capacitor Csen 1223 is connected to the SCOM node through the switch XXL 1221, and then on to discharge transistor DT 1215 to provide the second discharge path (SEN path) from the SEN node to SRCGND for the second of the sensing operation. The SEN node is also connected to the latch 1225 to latch the result of the sensing operation, which is turn connected to the data bus DBUS. Depending on the embodiment, the latch 1225 can include a number of individual latches for use in multi-state reading and writing or for other data operations. The elements of FIG. 12 described so far are largely as described above with respect FIG. 11, except that to simplify FIG. 12 the bias control block (1131 of FIG. 11) to provide the control signals for the various switches is not shown (but is to be included in the device). Some of the waveforms provided to the elements in FIG. 12 are shown in FIG. 13, as described below.

FIG. 12 explicitly shows a number of elements not shown in FIG. 11, but which can be added in various embodiments. A switch NLO2 1207 is connected between SRCGND and a node between BLS 1206 and BLC2 1211, allowing for BL 1205 or BLI to be pre-charged or set to various voltage levels from SRCGND. A switch INV 1216 is connected between the discharge transistor DT 1215, allowing for the sense amp to be selectively isolated from SRCGND, as the SRCGND node may be connected to a line commonly shared by a large number of other sense amps. A switch GRS 1217 is connected in parallel with DT 1215, allowing DT 1215 to be bypassed if, for example, the level on BLI is low so that DT 1215 is off, and the sense amp needs to discharge the DCOM node above DT 1215 to SRCGND. These and various other switches can be added to the sense amp circuit to improve operation and versatility.

The embodiment of FIG. 12 also includes some additional elements that do not directly enter into the main sensing operations described here, but can also add to its versatility. A switch BIAS 1204 can connect the bit line to a level BLBIAS that can be used in biasing a selected bit line for various memory operations. Also, another path to the central SCOM node is provided through a switch BLX 1241 (and possibly additional switches) to a high sense amp voltage VHSA. Although not used in the sensing operations mainly described here (where all data states are sensed by discharging the SRC line 1203 through the memory cell 1201 into the sense amp), more standard sensing operations as illustrated in FIG. 10A (where the sense amp/bit line discharge through the memory cell 1201 into CELSRC 1203) could use the switch BLX 1241. For example, rather than sense all states as illustrated by FIG. 10C, successively raising CGRV from 0V through the various read valued, the approach of FIG. 10C could be used for negative Vt states and then switch to the approach of FIG. 10A for the non-negative Vt states that do not require a negative CGRV value when using the approach of FIG. 10A.

As described above with respect to FIG. 11, the sense amplifier arrangement of FIG. 12 can be used to perform a sensing operation on a selected memory cell by a first phase using the first discharge path "BL path" to discharge the source line 1203 through the selected memory cell 1201 and on through the discharge transistor DT 1215 to SRCGND. This will set the node at BLI, and the control gate on DT 1215, to a voltage level dependent on the data state of the memory cell relative to the voltage level CGRV on the corresponding word line. Once the level on BLI node is stabilized, the switches BLC2 1211 and BLC 1213 are turned off leaving the control gate of DT 1215 to float, the conductivity of DT 1215 determined by the conductivity of the selected memory cell 1201. In the second phase, the switch XXL 1221 is turned on to discharge the pre-charged node SEN through DT 1215 to SRCGND at a rate based on the conductivity of DT 1215, which is in turn based on the conductivity of the memory cell 1201. After a discharge period, the level on SEN is captured by the latch 1225 to give the sensing result.

To reduce noise on the BLI node, and the gate of discharge transistor DT 1215, when the switches BLC2 1211 and BLC 1213 are turned off during the transition, the de-coupling capacitor Cdecop 1212 is introduced. This capacitor helps to compensate and correct for the possibly of unwanted coupling to the gate of the discharge transistor DT 1215 and provide a more accurate sensing result. The lower plate of Cdecop 1212 is connected to the BLI node, with the upper plate connected to a level BLI_BST that can allow the de-coupling capacitor Cdecop 1212 to track the operating conditions, such as temperature, and device corners in order to obtain a more accurate sensing result. In some embodiments, Cdecop 1212 can be implemented as a transistor with both its source and drain connected to the BLI node and its control gate connected to the level BLI_BST.

Another source of noise during the transition between phases and the subsequent discharging of the SEN node can come from noise in the SRCGND level, where the SRCGND line will typically be shared by a large number of sense amps that will concurrently be dumping current into the SRCGND line. A supplemental current source through the switch NLO 1218 is connected to a sense amp voltage LVSA to provide a keeper current through the discharge transistor 1215. A clamp device DCL 1219 clamps the drain voltage (at node DCOM) of discharge transistor DT 1215 during the sensing. These devices help block the possible noise through discharge transistor DT 1215 and keep a constant current through to the commonly regulated node SRCGND. This can help remove the detrimental noise at SRCGND node during sensing.

FIG. 13 illustrates waveforms for the control signals from the biasing circuitry for some of the control signals for FIG. 12 in one embodiment for a sensing operation. The waveforms are marked at times t0-t10, where t0-t3 is preparatory period; t3-t6 is the first phase where the source line CELSRC 1203 is discharged into the sense amp and the level on the control gate of the discharge transistor DT 1215 is set; t6-t8 is the transition between phases; t8-t9 is the second phase when the SEN node is discharged along the second discharge, or SEN, path; and t9-t10 is the strobe period when the value on the SEN node is latched.

The control signals for some of the devices in FIG. 12 are not included in the waveforms of FIG. 13. INV 1216 in on, and GRS 1217 is off during the all of the shown period of t1 to t10. The bit line select switch BLS 1206 is on for the whole period, or at least until the first phase concludes at t6. As discussed above, the switches BIAS 1204 and BLX 1241 are not active in the sensing operation described with respect to FIG. 13 and would both be off. DCL 1219 acts as a voltage clamp for the node DCOM and has its gate set for this purpose.

Starting at t0 for FIG. 13, BL 1205, the nodes BLI, SCOM, SEN and SRCGND are all low, as are the control signals on NLO2 1207, BLC2 1211, BLC 1213, XXL 1221, the CLK signal to the plate of Csen 1223, and NLO. Between t0 and t1, the array is biased. This can include setting the SRC line 1203, the selected and unselected word lines, select gates, or other levels needed to bias a selected memory cell 1201, depending on the architecture of the array.

Between t1 and t2, the initial levels for the sense amp are set. The SRCGND line is raised to an initial high value and NLO2 1207 is turned on, as is BLC2 1211. This sets the values on BL 1205 and the node at BLI high. Once the bit line and internal bit line are set, between t2 and t3, NLO2 is turned off and SRCGND is lowered to the level used during the following discharge phases.

The first discharge phase along the first discharge path labelled BL path in FIGS. 11 and 12, when the source line CELSRC 1203 discharges through the selected memory cell 1201 into the sense amp, begins at t3 when BLC 1213 is turned on, connecting the central common sense node SCOM to BLI. The bit line BL 1205 and BLI begin to discharge between t3 and t4, while SCOM charges up. The level on all these three top traces will depend on the conductivity of the selected memory cell, where HC is a highly conductive cell, MC a cell of middle conductivity, and NC a non-conducting cell. As shown, BL, BLI and SCOM will stabilize at t4 with the high conductively cell highest, the non-conducting cell lowest, and the intermediate state in the middle. To prepare for the next phase, at t4 the SEN node is pre-charged, which can be done from the latch 1225, followed by raising the CLK signal to Csen 1223 at t5, which further raises the level on SEN. By t6, the level on BLI (and the control gate of DT 1215) is stabilized at a level based on the conductivity of the selected memory cell and the SEN node is pre-charged, setting the conditions for the second discharge phase.

At t6, BLC2 1211 and BLC 1213 are turned off, isolating the BLI node, so that from t7 on, BLI is floating (represented by the broken lines) at a level based the memory cell's conductivity. This cuts off the discharge path from the source line CELSRC 1203 and causes the bit line 1205 to go high, where it will stay for the rest of the process, and SCOM to discharge through the discharge transistor DT 1215 and bounce about. This also results in coupling noise on BLI and the gate of DT 1215, as illustrated in FIG. 13 by the jagged outlining of the BLI levels between t6 and t8. The decoupling capacitor Cdecop 1212 is used to help correct for this noise, where the level BLI_BST on the upper plate of Cdecop 1212 can track temperature and device corners to provide a more accurate sensing result.

The fluctuations on the SCOM node and the BLI node also introduce noise on SRCGND, which can be very sensitive to noise, as shown by the jagged outline of SRCGNE between t6 and t7. To help remove this noise, the supplemental current from NLO 1218 and the clamp DCL 1219 to keep the level at DCOM help to stabilize the SRCGND node and the SCOM node. As shown on the bottom trace, NLO 1218 is turned on to provide the supplemental keeper current at t7.

At t6, the SEN node has been pre-charged and the control gate of DT 1215 and SRCGND have be stabilized. XXL 1221 is then turned on to discharge the SEN node. The transition in XXL 1221 can again introduce noise for SRCGND, which the keeper current from NLO 1218 will also help stabilize. When XXL 1221 turns on at t8, SCOM and SEN begin to discharge at a rate determine by the gate voltage on DT 1215, which was in turn set by the conductivity of the memory cell. As shown, between t8 and t9 the HC state discharges most rapidly and the NC state shows almost no discharge, while the MC state falls in the middle. At t9-t10, the level on SEN is latched, after which the sensing operation is complete.

Figure 14:
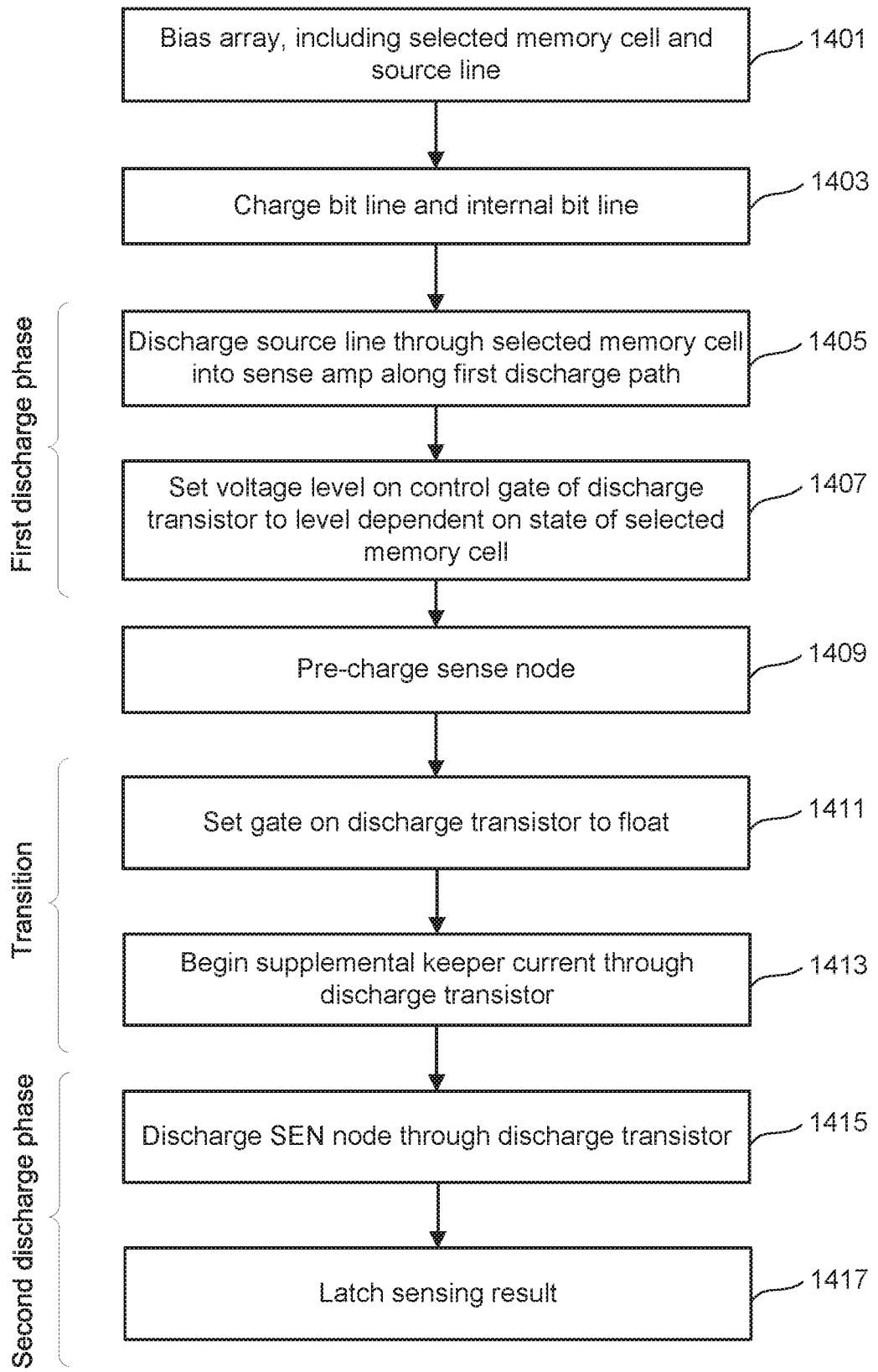
FIG. 14 is a flow chart describing one embodiment of a process for a sensing operation for the sense amplifier of FIG. 12 using the waveforms of FIG. 13.

FIG. 14 is a flow chart describing one embodiment of a process for a sensing operation for the sense amplifier of FIG. 12 using the waveforms of FIG. 13. Beginning at step 1401, the selected memory cell 1201, source line 1203, and any other array elements (select gates, non-selected memory cell on the same NAND string, etc.) are biased in preparation for the sensing operation. This corresponds the t0-t1 section of FIG. 13. In step 1403, the bit line BL 1205 and internal bit line BLI are charged up, corresponding to the period of t1-t3 of FIG. 13. The first discharge phase then begins in step 1405.

In step 1405, the switch BLC 1213 is turned on and the source CELSRC 1203 begins the first discharging phase through the selected memory cell 1201 along the first discharge path (BL path), eventually stabilizing at a level depending on the conductivity of the selected memory cell 1201. The level on BLI during this process is also the level on the control gate of the discharge transistor DT 1215, corresponding to step 1407. Steps 1405 and 1407 are during the period t3-t6 of FIG. 13.

The SEN node is pre-charged at step 1409. In the embodiment of FIG. 13, this occurs during the period t4-t6, during the first discharge phase along the BL path. Other embodiments can have this step earlier or later, as long as the SEN node is prepared for subsequent discharge along the SEN path at step 1415.

Steps 1411 and 1413 are part of the transition between the two phases, corresponding to the period t6-t8 in the embodiment of FIG. 13. At step 1411, the BL path for discharge is cut off and the control gate of DT 1215 is set to float at the level on BLI by turning off of the switches BLC2 1211 and BLC 1213. The capacitor Cdecop 1212 helps to reduce the noise on BLI, where having the upper plate connected to the level BLI_BST can help with variations due to operating conditions or process corners. At step 1413, the auxiliary keeper current from NLO 1218 begins, helping to stabilize SRCGND.

The second discharge phase for the second discharge path, the SEN path, corresponding to the period t8-t9, begins at step 1415. The switch XXL 1221 is turned on and the SEN node discharges through DT 1215, whose control gate was set based on the conductivity of the selected memory cell 1201 at step 1407. For the embodiment of FIG. 13, the keeper current is kept running during this period to keep SRCGND noise down. At step 1417, the level on SEN is latched to provide the sensing result and concluding the sense operation.

The sensing techniques and sense amplifier structures described above with respect to FIGS. 10-14 can be modified to further improve program performance for memory systems using multi-level cells (MLC). As described above with respect to FIGS. 6-8, to program memory cells to their respective target data states, the memory system applies multiple program pulses to the selected memory cells. Throughout the sequence of program pulses, the system verifies the memory cells to see whether they have met their respective Vt target value. This process can require multiple verify pulses after each programming pulse. The following presents techniques based on the sense amplifier structure described above to reduce the number of program verify pulses to effectively improve the memory circuit's write performance.

More specifically, in a conventional sensing technique, a sense amp is discharged through the corresponding memory cell to a source line. The system can vary the bit line level to sense more than one state at once; however, varying the bit line level affects only the corresponding memory cell's drain to source voltage (Vds). In a sensing arrangement where the source line is instead discharged through the memory cell into the sense amp, multiple target data states can be sensed at the same time by changing the bias voltage on the corresponding bit lines. In this type of sensing arrangement, changing a bit line's voltage level affects the corresponding cell's Vds and its gate to source voltage (Vgs), which can provide enough Vt movement to sense two or more data states at the same time.

In a convention program/verify sequence, after a program pulse the memory system can verify multiple target states one by one. For example, referring to the data states illustrated in FIG. 6, after a program pulse, the memory system may sequentially verify the data states S1, S2, and S3, for example. Following the next programming pulse, the memory system may sequentially verify the data states S2, S3, and S4. In each case, of the programming pulses is followed by multiple sensing operations as part of the program verify process.

If the memory system is able to verify two or more states at the same time, the same portion of the program/verify sequence could instead be: apply a program pulse; concurrently verify the S1 and S2 data states; verify data state S3; apply the next program pulse; verify data state S2; and then concurrently verify data states S3 and data state S4. Thus, the number of verifies between each programming pulse is reduced from three to two, significantly improving programming performance. As there are fewer sensing operations, this technique can also reduce current/power consumption.

The techniques described in the following discussion present program verify techniques to sense multiple data states concurrently for a set of memory cells connected to a common word line. Even though the memory cells will all receive the same word line voltage applied to the control gates, their bit lines can be individually biased to different voltage levels. This allows different states to be sensed when the memory cells discharge a current from a source line into their respective sense amplifiers. The technique can be applied to both data reads and program verifies; and, since in a program verify the memory cells' target data states are known, this lets the memory system verify multiple data states concurrently.

Figure 15B:
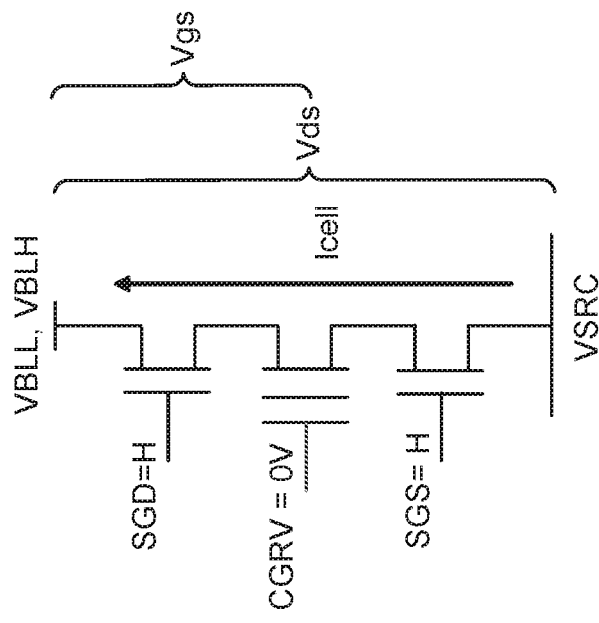
FIGS. 15A and 15B respectively consider the effects of varying the bit line voltage on a more conventional sensing operation and on a sensing operation where the source is discharged into the sense amplifiers.
Figure 15A:
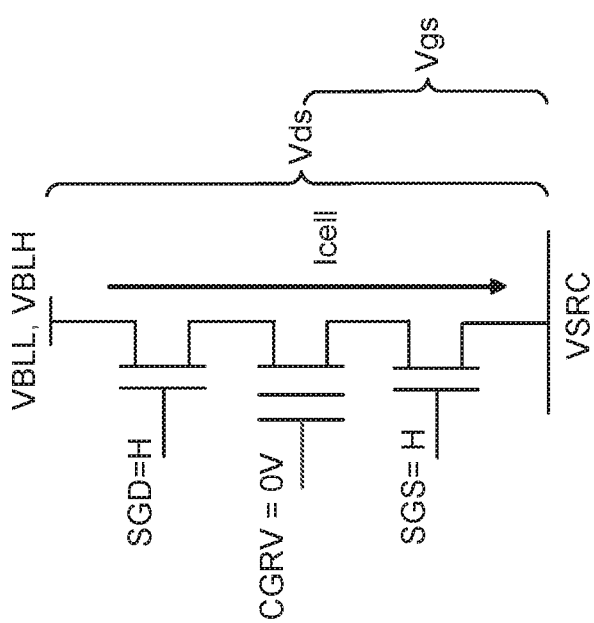

FIGS. 15A and 15B respectively consider the effects of varying the bit line voltage (VBL) on a more conventional sensing operation, where the sense amplifiers discharge into the source line, and on a sense operation where the source line is discharged into the sense amplifiers. More specifically, FIGS. 15A and 15B look at a (single memory cell) NAND string biased as in FIGS. 10B and 10C, respectively. In FIG. 15A, the NAND string is biased to allow a non-negative voltage for the word line, such as CGRV=0V, to be used to sense negative Vt states. The select gates (and any non-selected memory cells) of the NAND string are biased high to be on, with the source line raised above ground; for example, the source line voltage VSRC can be in the 0.8-1.5V ranges, such as about 1V or a little higher. This places the source of the selected memory cell at VSRC and allows for negative Vt sensing with a non-negative word line voltage. To discharge the bit line by Icell through the selected memory cell, the bit line is then pre-charged to a level above the source line; for example, VBL can be in the 1.2-1.8V range, such as around a volt and half, placing it a few tenths of a volt above VSRC. The bit line is then discharged for a sensing interval, with the result then latched by the corresponding sense amp for the read result.

Still referring to FIG. 15A, to sense different data states with the same word line voltage, the bit line voltage VBL can be varied, introducing a low VBL value VBLL and a high VBL VBLH, such that VBLH>VBLL>VRSC>0V. For example, a VBLL in the range 1.2V to 1.6V, such as 1.4V, could be used to sense a lower data state (e.g., S1) and a VBLH of 0.2V higher, for example, could be used to sense a higher data state (e.g., S2). When sensing a memory cell during a program verify, the system knows which target state is being written and, consequently, which state needs to be verified. Each bit line can then be biased according to the data state to be verified. Under this arrangement, adjusting VBL only changes a memory cell's Vds.

FIG. 15B illustrates the sensing arrangement where the source line is raised to a voltage level above the bit line voltage level, VSRC>VBL>0V so that the source line is discharged through the memory cell into the bit line and sense amp. FIG. 15B illustrates this by the current Icell running upwards towards the bit line, rather than in the conventional direction toward the source line as in FIG. 15A. For example, the source line can be set in the range VSRC=2.0-2.5V, such as a little over 2V, and the bit line voltage, VBL, set a few tenths (e.g., 0.2-0.7V) of a volt less. With CGRV=0V, this allows for sensing of a Vt down to about, for example, −1.8V or even further depending on the VSRC and VBL levels. As discussed above, the approach of FIG. 15B can be used for deep negative threshold voltage sensing.

As discussed above for FIG. 15A, during a sensing operation, different VBL levels can be used to sense different Vt levels for the memory cells; and, as during a verify, the memory system knows a given memory cell's target state, the system can adjust each bit line accordingly. Unlike the situation for FIG. 15A, as the current Icell in FIG. 15B runs from the source line to the bit line, effectively switching the source and drain roles for the selected memory cell, when VBL is adjusted this changes the memory cell's Vgs and well as its Vds, making it more effective in sensing two or more states at the same time. To sense different data states, the bit line voltage VBL can be varied, introducing a low VBL value VBLL and a high VBL value VBLH, such that VRSC>VBLH>VBLL>0V. For example, a VBLL in the range 1.3V to 1.7V, such 1.5V, could be used to sense a higher data state (e.g., S2) and a VBLH of 0.2V higher in the range of 1.5V to 1.9V, such as 1.7V, could be used to sense a lower data state of a pair (e.g., S1).

Figure 16B:
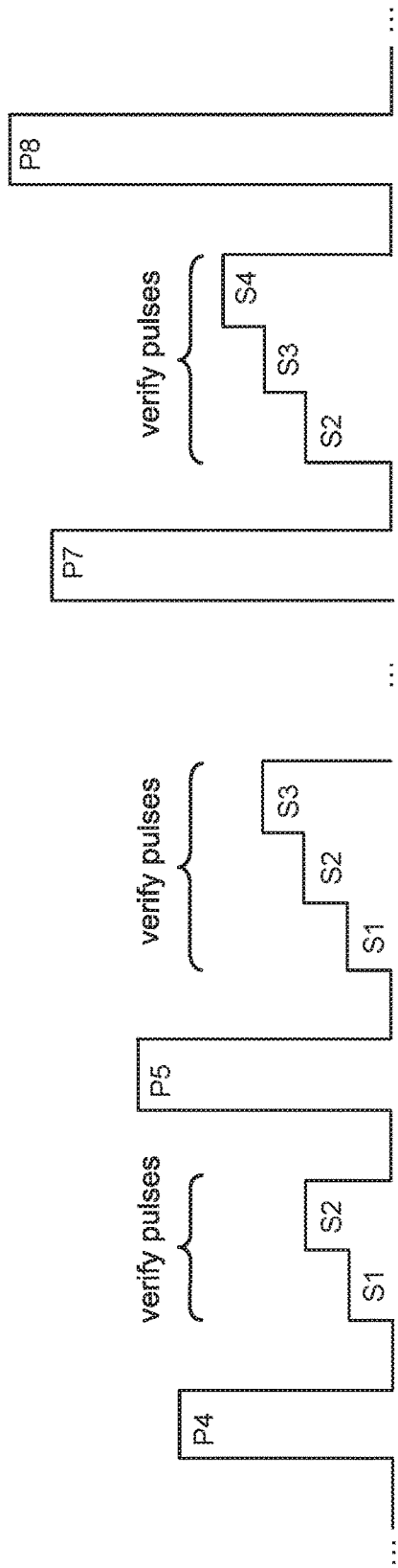
FIG. 16B shows a portion of the corresponding programming waveform for the embodiment illustrated in FIG. 16A.

FIGS. 16A-16C and FIGS. 17A-17C, respectively, consider a typical program verify process and a program verify process where multiple data states can be verified concurrently. FIG. 16A illustrates one embodiment for a smart verify algorithm for a 3-bit per cell embodiment as shown in FIG. 6, illustrating which data states would be verified after a given voltage pulse. More specifically, FIG. 16A plots the target state to which a memory cell is being programmed against the program loop number, or number of voltage pulses that have been applied, in a smart verify algorithm. The shaded squares correspond to the states verified after the voltage pulse of each loop, where the smart verify arrangement checks only those states likely to still be programming for non-defective cells. For example, initially only the data state S1 is being verified, with the S2 data state added after pulse 3 and the S3 data state added after pulse 5. After the 7th voltage pulse, the lowest data state S1 has been dropped and data state S4 added. The process continues, dropping lower states and adding higher states, until only the highest state S7 is verified after the final two pulses. In this embodiment, except for after the first two and last two pulses, each inter-pulse verify has two or three sensing operations. When to add and drop states can be determined in a number of ways. For example, there could be parameters determined and set based on device characterization tests. In some embodiments, these parameters could depend on factors such as the number of program/erase cycles to take into account device aging, as memory cells often program faster as they are cycled. Alternately, or additionally, states can be added or dropped based on the results of earlier verify operations. For example, if at the initial verify for a the data state S4 more or less than the expected number of cells verify, verifies for data state S5 and other higher states can be introduced sooner or later; and if a given all memory cells being written to a given data state are found to have completed programming, subsequent verifies for that state can be dropped.

Figure 16C:
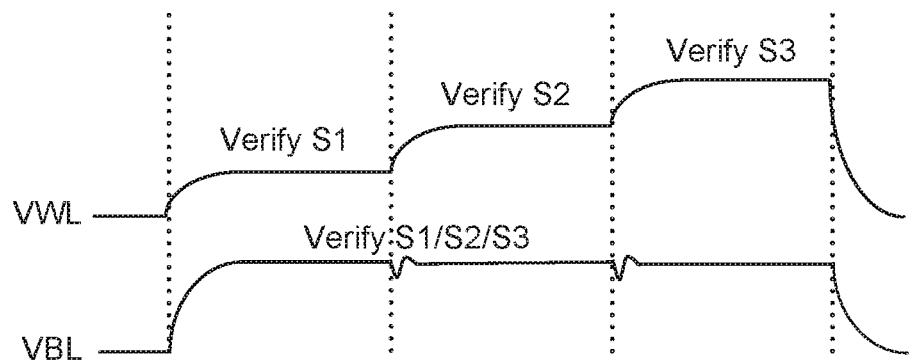
FIG. 16C looks at the word line and bit line voltage levels for the verify following a pulse of FIG. 16B.

FIG. 16B shows a portion of the corresponding programming waveform for the embodiment illustrated in FIG. 16A. More specifically, FIG. 16B shows the word line voltage VWL applied to a selected word line, depicting some of the programming pulses (P4-P8) and inter-pulse sensing voltages for the verify operations. Corresponding to FIG. 16A, after pulse P4, data states S1 and S2 are verified by first raising the word line to the sensing level to verify data state S1, then further raised to verify data state S2. After pulses P5 and P7, three steps are used for VWL, respectively corresponding to data states S1, S2, S3, and to states S2, S3, S4. FIG. 16C looks at the word line and bit line voltage levels for the verify following pulse P4. As shown at top, VWL is successively raised to the level to verify data state S1, then to verify data state S2, and finally to verify data state S3. For sensing all three of these states scheduled to be verified after P4, the same VBL is used.

FIG. 17A corresponds to FIG. 16A, but where two states can be verified at the same time. In both of FIGS. 16A and 17A, the same states are verified after a given pulse, but in FIG. 17A, the pairs of (S1, S2), (S3, S4) and (S5, S6) are verified concurrently in this embodiment. Other embodiments can pair the states differently (e.g., pair S2 with S3), or group more than two states for a concurrent verify. As illustrated in the right-most column of FIG. 17A, in this embodiment the data states S1, S3, S5, and S7 use the higher bit line verify voltage VBLH and the data states S2, S4, and S6 use the lower bit line verify voltage VBLL. For example, VBLL can be in the range 1.3V to 1.7V, such as 1.5V, and VBLH a few tenths of a volt higher in the range of 1.5V to 1.9V, such as 1.7V, although other values can be used depending on the embodiment. If three states are sensed together, three VBL levels would be used and so on.

Figure 17B:
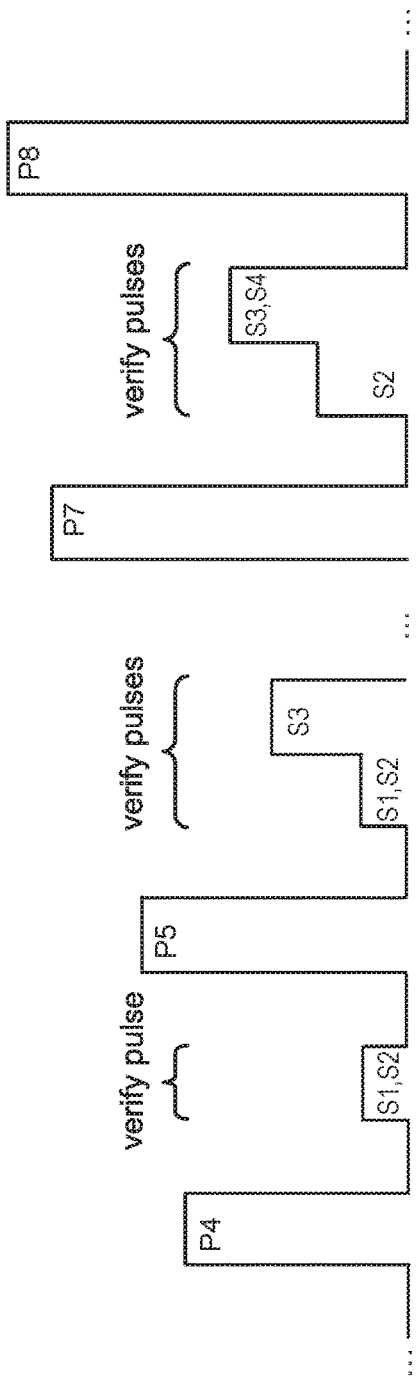
FIG. 17B shows a portion of the corresponding programming waveform for the embodiment illustrated in FIG. 17A.
Figure 17C:
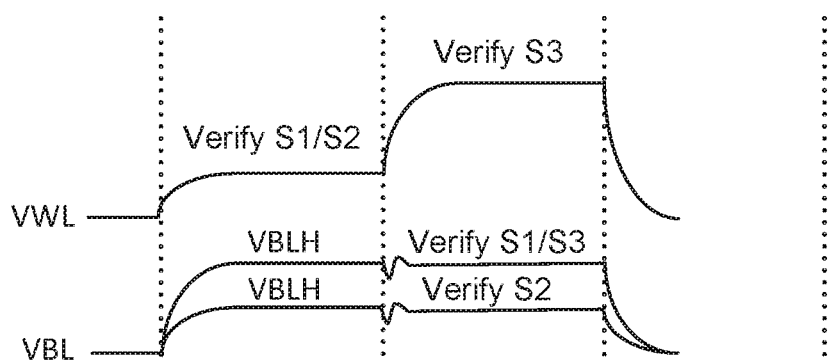
FIG. 17C looks at the word line and bit line voltage levels for the verify following a pulse of FIG. 17B.

FIGS. 17B and 17C correspond to FIGS. 16B and 16C, but where pairs of states are verified concurrently as illustrated in FIG. 17A. Following pulse P4, only a single sensing operation is used to sense both data states S1 and S2 at the same time, rather than using separate sensing operations as in FIG. 16B. Following pulse P5, data states S1 and S2 are again sensed at the same time, followed by a sensing operation for data state S3, reducing the number of separate verify sensing from three to two. Similarly, after P7, data states S3 and S4 are verified concurrently, again reducing the number of separate inter-pulse verifies from three to two. FIG. 17C illustrates the VWL and VBL waveforms for the verify after P4. VWL now has just two steps, first to a common verify level for data states S1 and S2, then to a verify level for data state S3. (Later, when data state S4 is added, it will use the same VWL as used to verify S3.) For the bit line, VBL uses the higher VBLH for sensing data state S1 at the first VWL step and for sensing data state S3 at the second VWL step. The lower bit line voltage VBLL is used for sensing data state S2 at the first VWL step.

As can be seen by comparing FIGS. 17A-17C to FIG. 16A-16C, the ability to verify multiple data states at the same time can significantly improve programming performance. Referring to FIG. 16A, this shows 37 verify operations for the 17 pulses in a 3-bit per memory cell embodiment, versus 28 verify operations for FIG. 17A when multi-state verify is used. For embodiments storing more bits per cell, the improvement will be even higher. Further, in addition to improving performance, fewer sensing operation will reduce current and power consumption.

Figure 18:
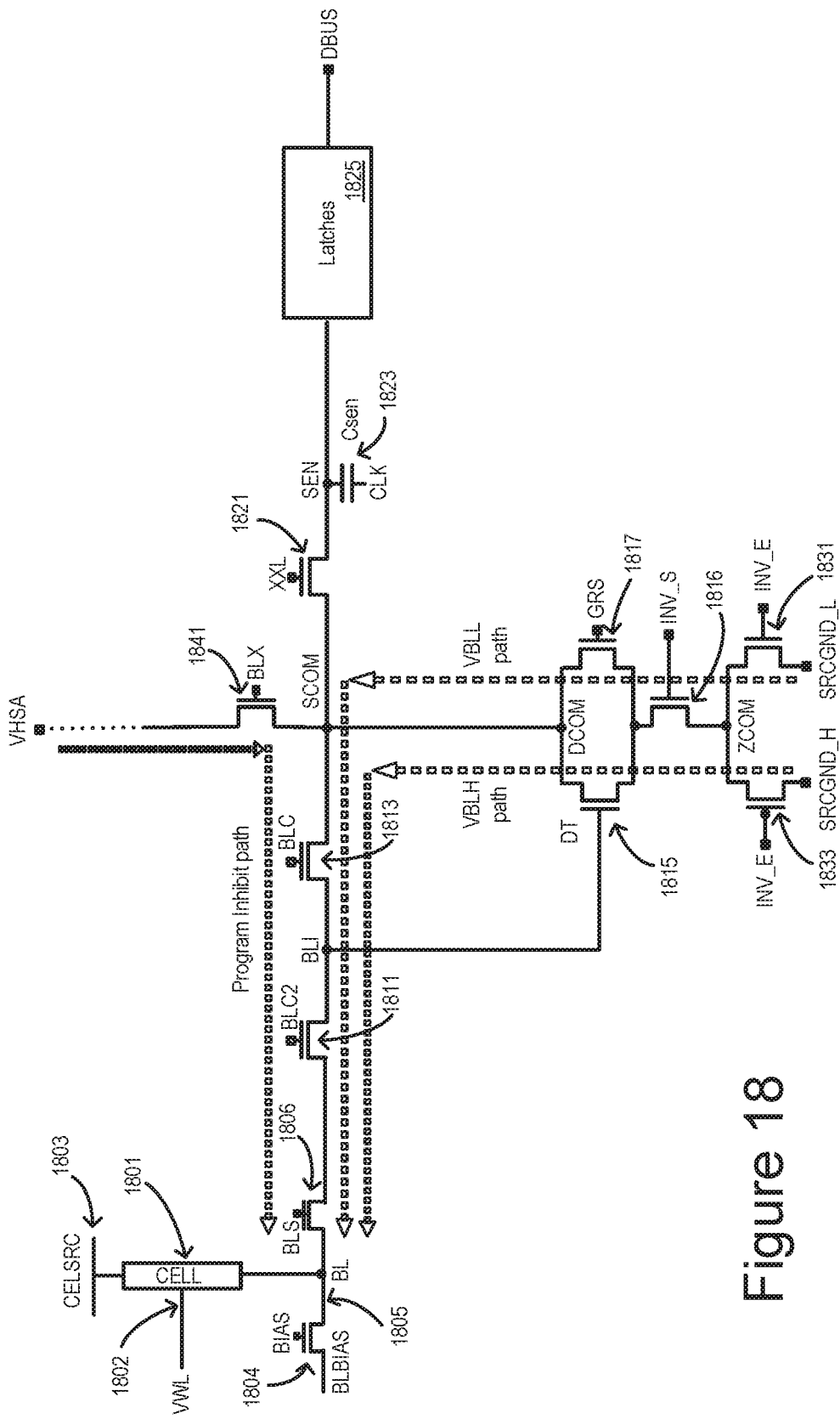
FIG. 18 illustrates one embodiment of a sense amplifier that can be used for multi-state verify.

For a sense amplifier to be able to selectively bias a bit line to multiple levels, the sense amplifier structure described above with respect to FIGS. 11 and 12 can be modified to provide multiple bias paths for the corresponding bit line. FIG. 18 illustrates one embodiment of a sense amplifier that can be used for multi-state verify, such as for the example of FIGS. 17A-17C, where two bit line bias levels can be used for a sensing operation.

FIG. 18 illustrates one embodiment of a sense amplifier that can be used for multi-state verify. FIG. 18 is similar to FIG. 12, repeating many of the same elements, adding some elements for multi-state verify, and omitting some elements to simplify the discussion. In FIG. 18, a memory cell 1801 is connected between a source line CELSRC 1803 and a bit line BL 1805, and has its control gate connected to a word line WL 1802. The memory cell 1801 can again be part of a NAND string of charge storing memory cells, such as described with respect to FIGS. 3 and 4, a memory cell based on a phase change memory material (PCM), such as described above with respect to FIG. 5, or of other memory technology. The bit line BL 1805 is connected to the sense amplifier through the decoding circuitry, here represented by the bit line select (BLS) switch 1806.

After the bit line select switch BLS 1806, the bit line BL 1805 is connected to the internal bit line BLI through switch BLC2 1811, and then through switch BLC 1813 to the central common sensing node SCOM. The node SCOM is connected through the discharge transistor DT 1815. The control gate of DT 1815 is again connected to the node at BLI, so that when the switches BLC2 1811 and BLC 1813 are turned off, the control gate of DT 1815 will be left floating at the level on BLI.

The SEN node with the capacitor Csen 1823 is connected to the SCOM node through the switch XXL 1821, and then on to discharge transistor DT 1815. The SEN node is also connected to the latches 1825 to latch the result of the sensing operation, which is turn connected to the data bus DBUS. Depending on the embodiment, the latches 1825 can include a number of individual latches for use in multi-state reading and writing or for other data operations. In particular, the latches 1825 can include a latch to set the INV_E signal level, as discussed below. A switch INV_S 1816 is connected between the discharge transistor DT 1815, allowing for the sense amp to be selectively isolated from SRCGND_L and SRCGND_H levels, as each of the SRCGND_L and SRCGND_H nodes may be connected to a line commonly shared by a large number of other sense amps. A switch GRS 1817 is connected in parallel with DT 1815, allowing DT 1815 to be bypassed. A switch BIAS 1804 can connect the bit line to a level BLBIAS that can be used in biasing a selected bit line for various memory operations.

Another path to the central SCOM node is provided through a switch BLX 1841 (and possibly additional switches) to a high sense amp voltage VHSA. The switch BLX 1841 can be used to set the bit line BL to the VHSA, as indicated by the arrows labelled "program inhibit path". By applying VHSA to the bit line of a memory cell 1801 during a programming operation, the channel of memory cell 1801 is raised and programming will be inhibited when a programming pulse is applied to word line WL 1802. During a programming operation, the memory cell 1801 can be locked out from further programming once it verifies at its target state or if it is to be left in the erased data state S0.

Relative to FIG. 12, FIG. 18 does not show the decoupling capacitor Cdecop 1212 connected to the node BLI, the switch NLO2 1207, the clamp device DCL 1219, or the supplemental current source NLO 1218. Depending on the embodiment, any or all of these elements can be included as described above with respect to FIG. 12, but are not explicitly shown in FIG. 18 to simplify the drawing for purposes of discussion.

To be able to bias the bit lines to either a high value VBLH and a low value VBLL as described above with respect to FIGS. 17A-17C, the node ZCOM can respectively be connected to SRCGND_H through PMOS 1833 and to SRCGND_L through NMOS 1831. A control signal INV_E is used to control both of PMOS 1833 and NMOS 1831, so that when INV_E is high, NMOS 1831 is on and PMOS 1833 is off to connect the ZCOM node to SRCGND_L; and when INV_E is low, NMOS 1831 is off and PMOS 1833 is on to connect the ZCOM node to SRCGND_H. If more than two states are to be verified concurrently, the sense amp can be structured to selectively connect a corresponding number of SRCGND levels to the ZCOM node. For example, for three states, a third SRCGNC level can be added and supplied through a corresponding third switch to provide the additional level to the ZCOM node and a corresponding set of control signals would be supplied to the switches to connected ZCOM to the selected SRCGND level.

To bias the bit line node BL to the high bit line level, the VBLH path is used, where INV_E is low and PMOS 1833 is on, so that SRCGND_H is connected to the BL node through INV 1816, GRS 1817 (and DT 1815 as the voltage on node BLI rises), BLC 1813, BLC2 1811, and BLS 1806. The SRCGND_H level is chosen so that, after the voltage drops along the way, the BL node is set at the desired VBLH level.

To bias the bit line node BL to the low bit line level, the VBLL path is used, where INV_E is high and NMOS 1831 is on, so that SRCGND_L is connected to the BL node through INV 1816, GRS 1817 (and DT 1815 as the voltage on node BLI rises), BLC 1813, BLC2 1811, and BLS 1806. The SRCGND_L level is chosen so that, after the voltage drops along the way, the BL node is set at the desired VBLL level.

Figure 19:
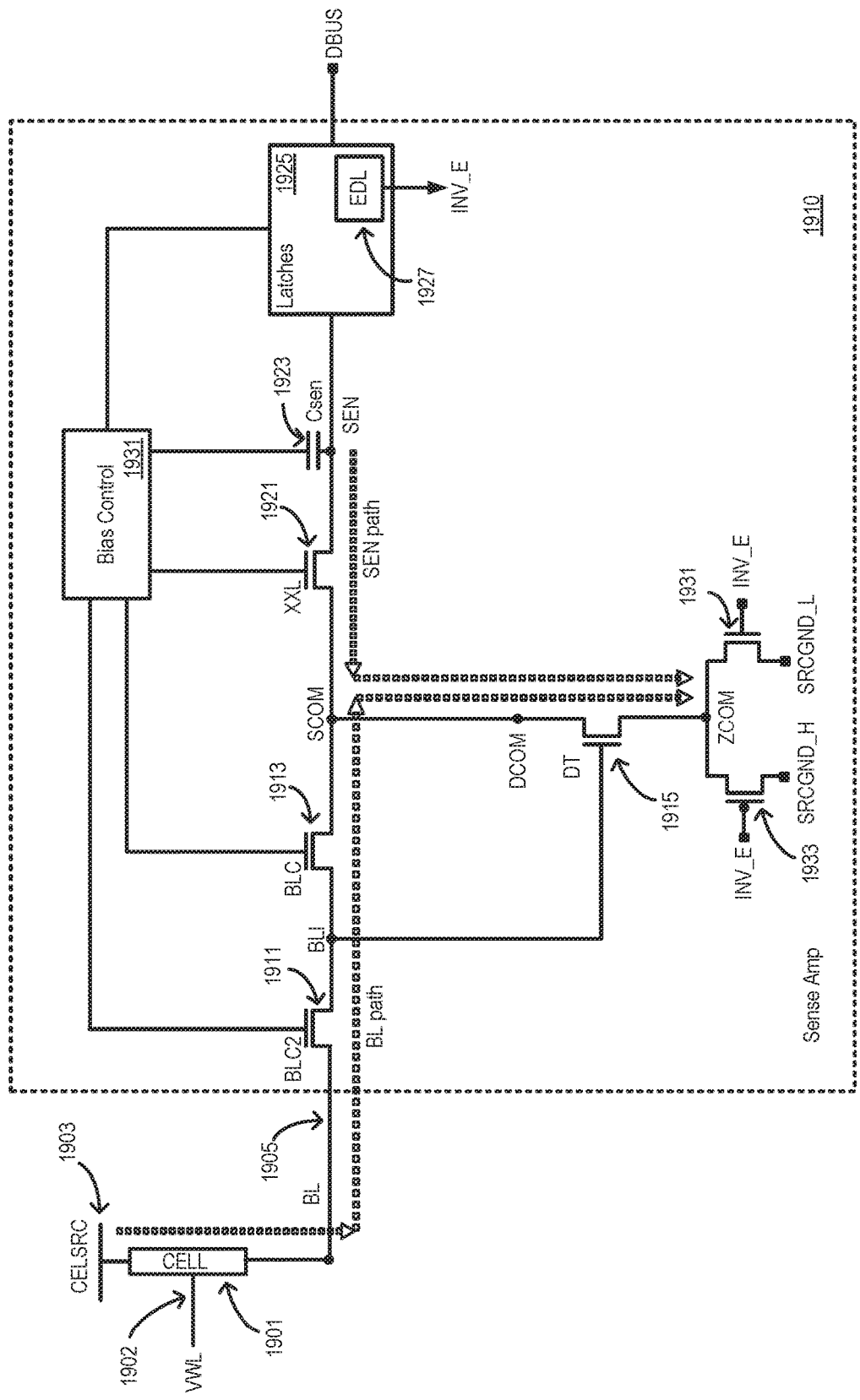
FIG. 19 illustrates a two phase sensing operation for the sense amplifier embodiment of FIG. 18 incorporating the two bias levels that can be selected for the bit lines in a sensing operation.

FIG. 19 illustrates the two phase sensing operation, similarly to FIG. 11, but now incorporating that two bias levels can be selected for the bit lines in a sensing operation. As with FIG. 11, the sense amplifier 1910 can correspond to one of the sense blocks SB1, SB2, . . . , SBp 150 in FIG. 1A. A selected memory cell 1901 is connected between the source line CELSRC 1903 and a bit line BL 1905. Other memory cells (e.g. of the same NAND string) are also connected between source line CELSRC 1903 and bit line BL 1905; however, those other memory cells are not depicted in FIG. 19 and will biased to be on during a sensing operation. The sense amplifier 1910 is typically selectively connectable to multiple bit lines through column decoding circuit also not shown in FIG. 19. The selected bit line BL 1905 can be discharged on the path labelled "BL path" through the series connected switches BLC2 1911 and BLC 1913 to the discharge transistor DT 1915, and then on through the discharge transistor DT 1915 to the node ZCOM. When INV_E is high and 1931 is on, the BL path with discharge to SRCGND_L is used; and when INV_E is high and 1933 is on, the BL path with discharge to SRCGND_H is used.

The value of INV_E can be set according to a data latch EDL 1927 in the set of latches at 1925.

The control gate of the discharge transistor DT 1915 is connected in a diode type arrangement to the internal (to the sense amp) bit line node BLI between BLC2 1911 and BLC 1913. When both of BLC2 1911 and BLC 1913 are on, the current flowing to the bit line BL 1905 from the memory cell 1901 can discharge along the BL path to either SRCGND_H or SRCGND_L; and when both of BLC2 1911 and BLC 1913 are turned off, the discharge BL path is cut off and the control gate of DT 1915 is left to float at the level on the node BLI between BLC2 1911 and BLC 1913.

To the right in FIG. 19, the second discharge path labelled "SEN path" allows for the sensing node SEN to also discharge through the switch XXL 1921 through the discharge transistor DT 1915 to either SRCGND_H or SRCGND_L. When XXL 1921 is on, any charge stored on the capacitor Csen 1923 will discharge at a rate determined by the control gate voltage on discharge transistor DT 1915 and the level on the node ZCOM. After discharging over a sensing period, a sensing result based on the level on the node SEN can then be set in the latch 1925 and the shifted out over the data bus DBUS.

The voltage levels and timing for the switches in FIG. 19 are controlled by the elements on the memory array such as the read/write circuits 128 and sense blocks SB1, SB2, . . . , SBp 150 in FIG. 1A, here represented by the bias circuitry of control block 1931. A sensing operation, such as a read or verify, is done in two stages. After the initial biasing of the source line SRC, bit line BL, the selected memory and other elements (such as select gates and non-selected memory cells in a NAND embodiment), the switches BLC2 1911 and BLC 1913 are turned on and the bit line is discharged along the BL path through the discharge transistor. The degree of discharge, or whether there is any current discharged at all, will depend on the word line voltage CGRV on the selected memory cell's control gate and the selected memory cell's threshold voltage Vt. Consequently, the voltage on the node BLI will depend on the memory cell's data state how this data state corresponds to the read level CGRV biasing the selected memory cell. After the voltage level on the node BLI is sufficiently stabilized, the switches BLC2 1911 and BLC 1913 are turned off, leaving the node BLI, and consequently the control gate of the discharge transistor DT 1915, to float at the level set during the bit line discharge phase.

Once the switches BLC2 1911 and BLC 1913 are turned off and the gate of the discharge transistor DT 1915 is floating at the level set during the bit line discharge phase, the conductivity of the transistor DT 1915 is based on the conductivity of the selected memory cell. In the sense node discharging phase, the switch XXL 1921 is turned on so that the previously charged sense node SEN and the sense node capacitor Csen 1923 can discharge through discharge transistor DT 1915 along the SEN path to either SRCGND_H or SRCGND_L. After a discharge time, the value at the SEN node can then be captured by latch 1925. As the discharge rate along the SEN path depends on the gate voltage on the discharge transistor DT 1915, which in turn depends on the state of the selected memory cell, the latched value corresponds to the data state.

Figure 20:
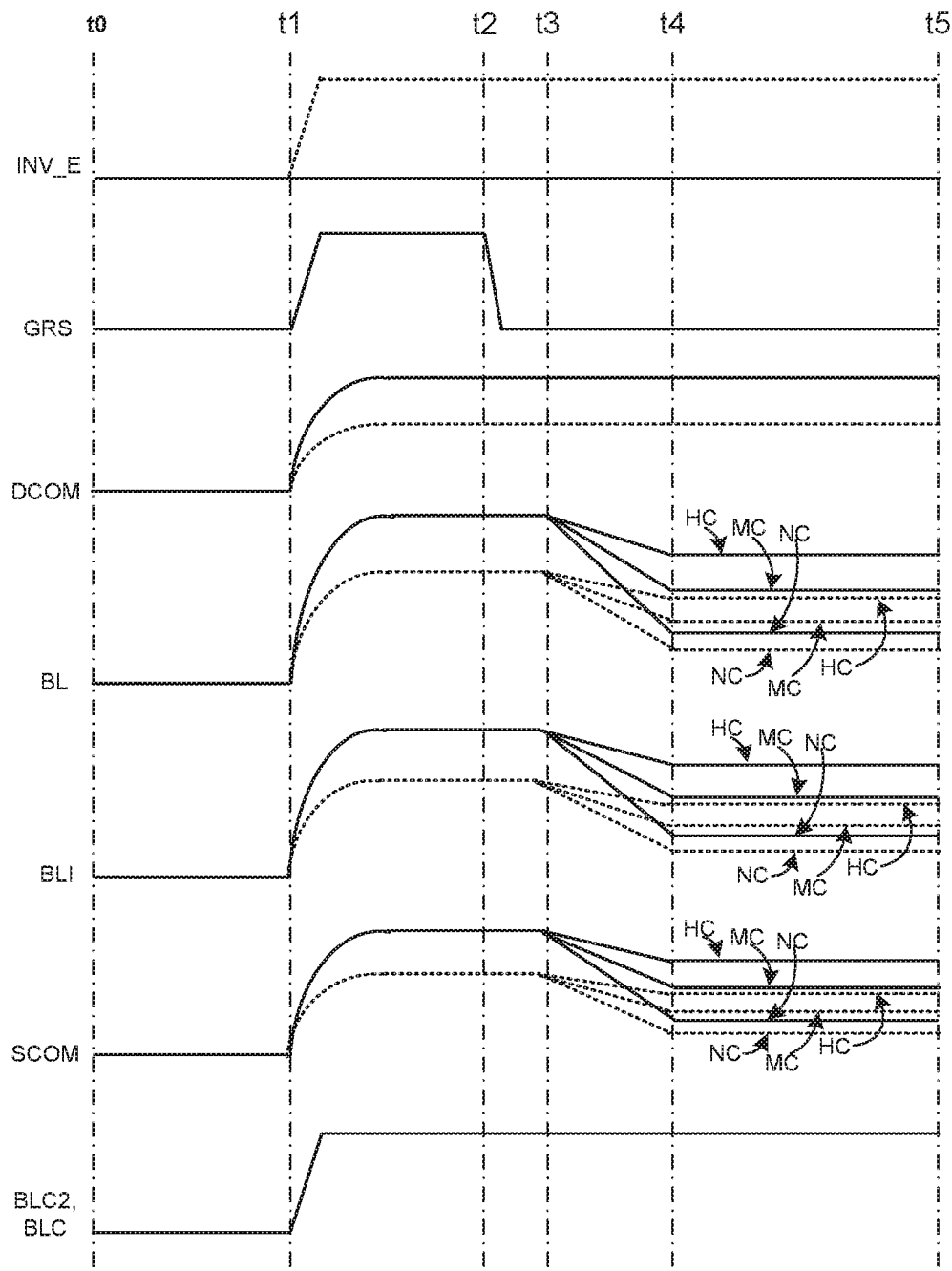
FIG. 20 is a set of waveforms describing one embodiment of a process for a sensing operation for the sense amplifier of FIGS. 18 and 19.

FIG. 20 is a set of waveforms describing one embodiment of a process for a sensing operation for the sense amplifier of FIGS. 18 and 19. Relative to FIG. 14, FIG. 20 illustrates one embodiment for some of the changes in the time period t0-t5 related to having the two bias paths for a selected memory cell's bit line so that it can be selectively biased to either VBLL or VBLH. The signals not shown in FIG. 20 can have waveforms similar to those represented in FIG. 14; and for the sensing phase following t6, when the SEN node is discharged through the discharge transistor DT 1815/1915, the process will also be similar, with the changes noted in the following.

At the top of FIG. 20 is the signal INV_E used to connect the node DCOM either to SRCGND_H through the PMOS 1833/1933 when INV_E is low (solid lines) or to SRCGND_L through the NMOS 1831/1931 when INV_E is high (broken lines). Once set at time t1, the INV_E stays at this level through the sensing phase beyond t5 when the SEN is discharged. Below the INV_E waveform is the corresponding waveform for the two levels on DCOM. To be able to pass either SRCGND_H or SRCGND_L to DCOM from ZCOM even if DT 1815/1915 is not on or not fully on, GRS is high between t1 and t2. This brings DCOM up to either the higher level corresponding to SRCGND_H (solid line) or SRCGND_L (broken line), depending on the INV_E value.

To be able to bias the bit memory cell's bit line, the switches between the DCOM node and BL need to be on. As shown at the bottom of FIG. 20, BLC and BLC2 go high at t1 and stay high through t5, before going low at t6 (as shown in FIG. 13) before the sensing phase when the node SEN is subsequently discharged. This brings up the voltage level on the nodes BL, BLI, and SCOM, where again the solid lines correspond to the VBLH levels and the broken lines correspond to the VBLL levels. The BL, BLI, and SCOM are all the same from t1 on, aside from voltage drops from intervening switches. After GRS goes low at t2, the BL, BLI, and SCOM levels all drop depending on whether the memory cell is in a high conducting state (HC), a middle conductivity state (MC), or a non-conducting cell (NC). Once the level is set on BLI, the BLC and BLC2 levels can be taken low to set gate voltage on the discharge transistor for the subsequent discharge phase.

Figure 21:
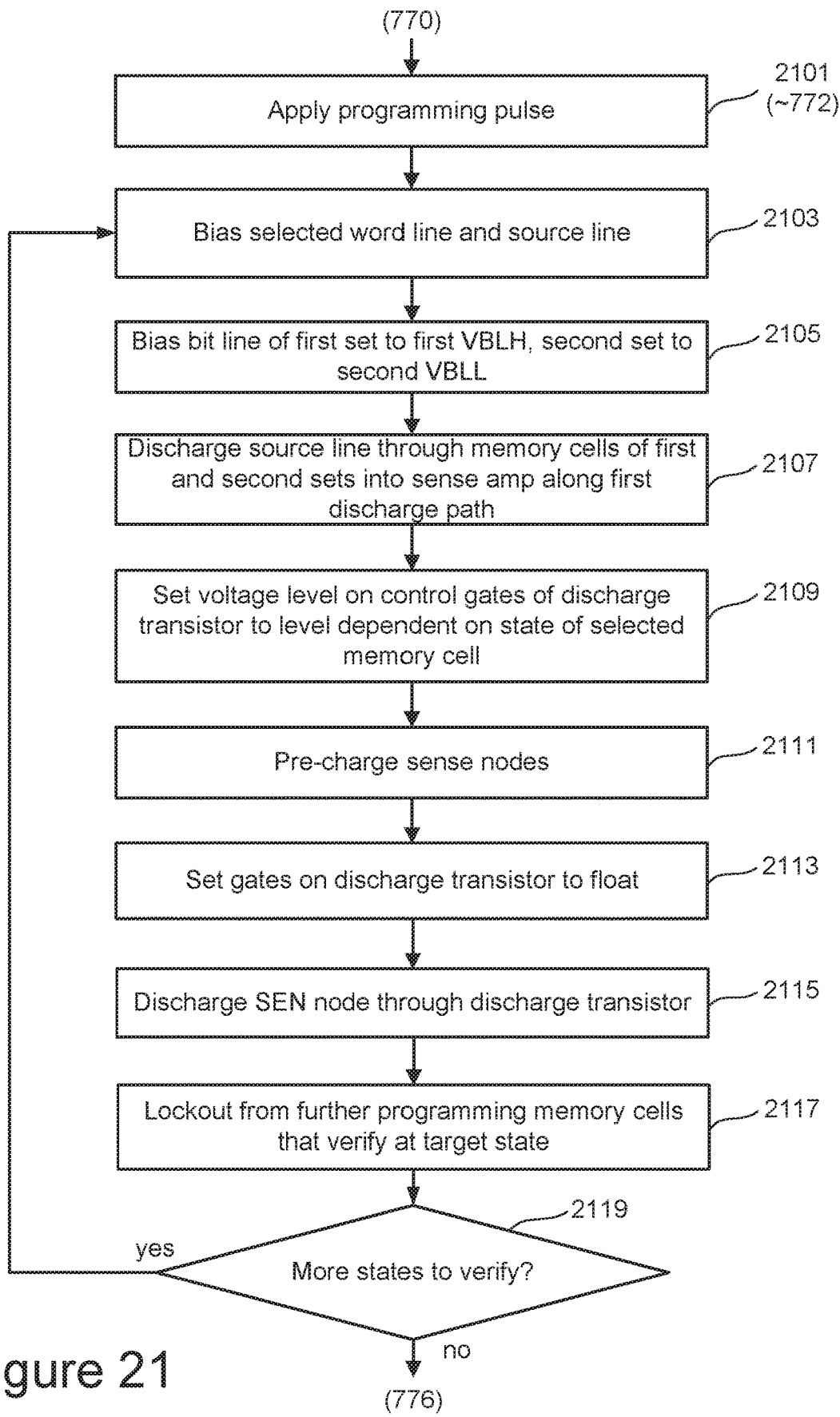
FIG. 21 is a flow chart describing one embodiment of a process for a multi-state verify operation for the sense amplifier of FIG. 18 using the waveforms of FIG. 20.

FIG. 21 is a flow chart describing one embodiment of a process for a multi-state verify operation for the sense amplifier of FIG. 18 using the waveforms of FIG. 20. The flow of FIG. 21 begins at step 2101 with the application of a programming pulse along the selected word line. The pulse of step 2101 can correspond to the pulse of step 772 of FIG. 7B, for example, and the following steps for the multi-state verify can correspond to a detailed description of the verify operation step 774 of FIG. 7B. Once a pulse is applied at step 2101, the verify begins at step 2103.

The sensing related steps of FIG. 21 (steps 2103-2115) can be as described with respect to FIG. 14 above, but now different bit lines can be biased to one of the different levels depending on the states to be sensed in order to perform a multi-state verify. At step 2103 the array is biased to set the selected word line is set to the first word line voltage of the verify operation and set the source line voltage. Referring to the embodiment FIG. 17A, if either or both of data states S1 or data state S2 is being verified, as after pulses 1-6, this will be the lowest of these values, where after pulse 9, for example, this will be the next higher sensing voltage used for data states S3 and S4. At step 2105, the bit lines of the memory cells to be verified are biased. For the set of memory cells of to be verify at the lower bit line level, such as S2, these will be biased to VBLL, and for the set of memory cells to be verified at the higher bit line level, such as data state S1, these will be biased to VBLH.

Figures 22, 23A, 23B:
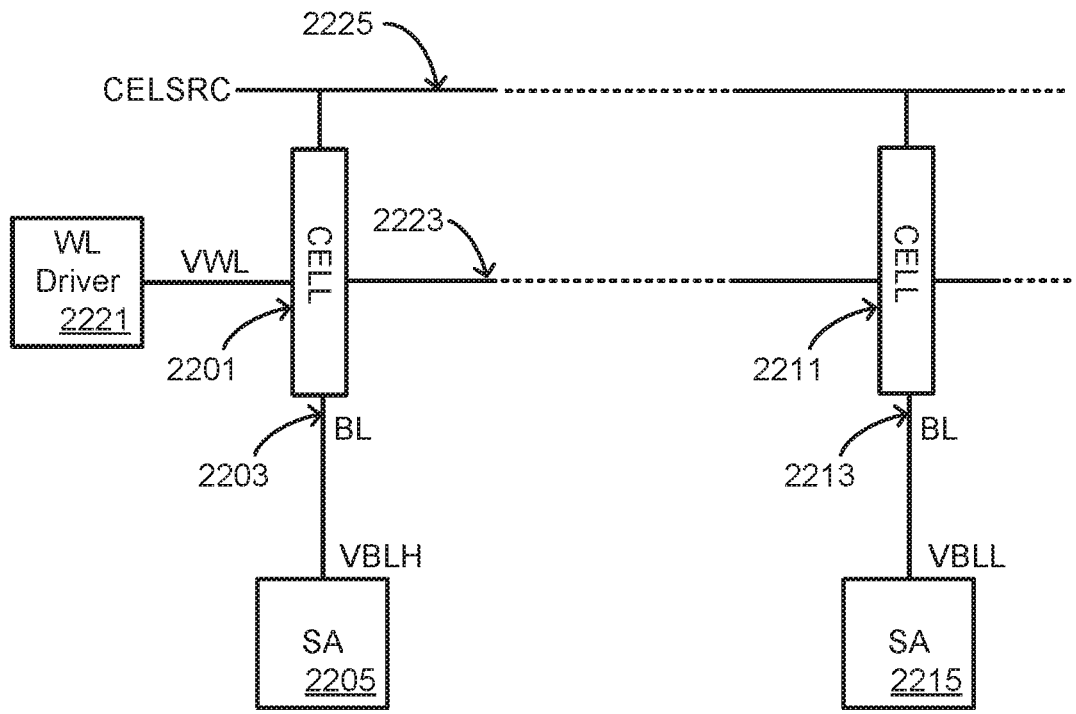
FIG. 22 is a schematic representation of the biasing of the array for the multi-state verify operation in the flow of FIG. 21.
FIG. 23A is a table describing one example of an assignment of data values to data states.
FIG. 23B illustrates data states that can be read to determine the upper, middle and lower pages and their corresponding bit line bias levels for the arrangement of FIG. 23A.

FIG. 22 is a schematic representation of the biasing of the array for the verify operation in steps 2103 and 2105. The selected word line 2223 is biased to the VWL level for the current verify by the driver 2221. For example, VWL can be the level to verify the data state levels S1 and S2 at the first step for VWL in FIG. 17C. A first set of memory cells to be verified for the lower data state at this step, such as S1, is represented at by memory cell 2201, which is connected between the source line 2225 and a corresponding bit line 2203. The bit line 2203 is biased to the VBLH by the source amplifier SA 2205. A second set of memory cells to be verified for the lower state at this step, such as data state S2, is represented at by memory cell 2211, which is connected between the source line 2225 and a corresponding bit line 2213. The bit line 2213 is biased to the VBLL by the source amplifier SA 2215. The source line is then discharged through the memory cells 2201 and 2211 to respective sense amplifiers 2205 and 2215. The sensing related steps of FIG. 21 (steps 2103-2115) can be performed similarly to the process of steps 1401 to 1415 of FIG. 14, but where the memory cells to be sensed have their bit lines biased based on whether they are in the first group, where the corresponding bit lines are biased VBLH, or in the second group, where the corresponding bit lines are biased at VBLL, for the sensing process steps.

Returning to FIG. 21 and referring to the embodiment of FIG. 18, in step 2107 the source CELSRC 1803 discharges through a selected memory cell 1801, the discharge transistor 1815, and either PMOS 1833 or NMOS 1831, eventually stabilizing at a level depending on the conductivity of the selected memory cell 1801. The level on BLI during this process is also the level on the control gate of the discharge transistor DT 1815, corresponding to step 2109.

The SEN node is pre-charged at step 2111. At step 2113, the bit line path for discharge is cut off and the control gate of DT 1815 is set to float at the level on BLI by turning off of the switches BLC2 1811 and BLC 1813. The discharge phase for the SEN node begins at step 2115. The switch XXL 1821 is turned on and the SEN node discharges through DT 1815, whose control gate was set based on the conductivity of the selected memory cell 1801 at step 2109, through either PMOS 1833 to SRCGND_H or NMOS 1831 to SRCGND_L, depending on the INV_E level. At step 2117, the memory cells that verify at their target state are locked out from further programming. Step 2119 determines whether there are more states to verify using another word line level. If so, the process loops back to step 2103. For example, referring to FIG. 17C, after sensing the data states S1 and S2, the flow would loop back to step 2103 to raise the word line for verifying the S3 data state. If there are no more states to verify, the flow can continue on with the program process. In the embodiment of FIG. 7B, for example, the flow can continue on to step 776 and subsequent steps, including any further programming pulses.

When subsequently reading back data programmed using the different bit lines levels during the verify sensing, the same biasing can be used for each state for consistency so that each state has the same Vds for both data read and program verify. Referring back to FIG. 17A, where the data states are paired as (S1, S2), (S3, S4), (S5, S6), the data states S1, S3, S5, and S7 use the high bit line level of VBLH (e.g., 1.7V) and the states S2, S4, and S6 are verified using VBLL (e.g., 1.5V). Consequently, the same VBL levels will be used for the read operation. If the states are paired differently (e.g., (S2, S3), (S4, S5), (S6, S7)) for verify, they can be similarly grouped for sensing; and if more than two states are grouped with different VBLs for multi-state verify, the same data state to VBL correspondence can be used for sensing. In terms of the sense amplifier designs, the use of the different VBL levels in a data read is not much of a concern as the capability will already be available for the multi-state sensing operation.

When storing multi-state data, the memory can organize the data in different formats. One way to organize data is into pages, where for the 3-bit per memory cell MLC memory the data is organized into 3 pages of data for each word line. FIG. 23A is a table describing one example of an assignment of data values to page-based data states. In the table of FIG. 8, S0=111, S1=110, 52=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 23A, all bits stored in a memory cell are 1 when the memory cells are erased (e.g., in data state S0).

To read each of these pages, a subset of the data states can be read, where which data states need to be read to determine a given page depends on the how the data states are encoded into pages. For the arrangement of FIG. 23A, FIG. 23B illustrates data states that can be read to determine the upper, middle and lower pages and their corresponding bit line bias levels. As illustrated in FIG. 23B, the data states S3 and S7 can be read to extract the upper page data, the data states S2, S4 and S6 to extract the middle page data, and the data states S2 and S5 for the lower page. When the data states are grouped as described with respect to FIG. 17A, the results in the bit lines being biased as illustrated in FIG. 23B, where all of the reads of a given page can use the same VBL level. Consequently, if only a single page is to be read, the same VBL level can be used. For other assignments of data states into pages or other groupings of data states for multi-state verify, the read of a given page may not have all sensing operations corresponding to a common VBL.

Figure 24:
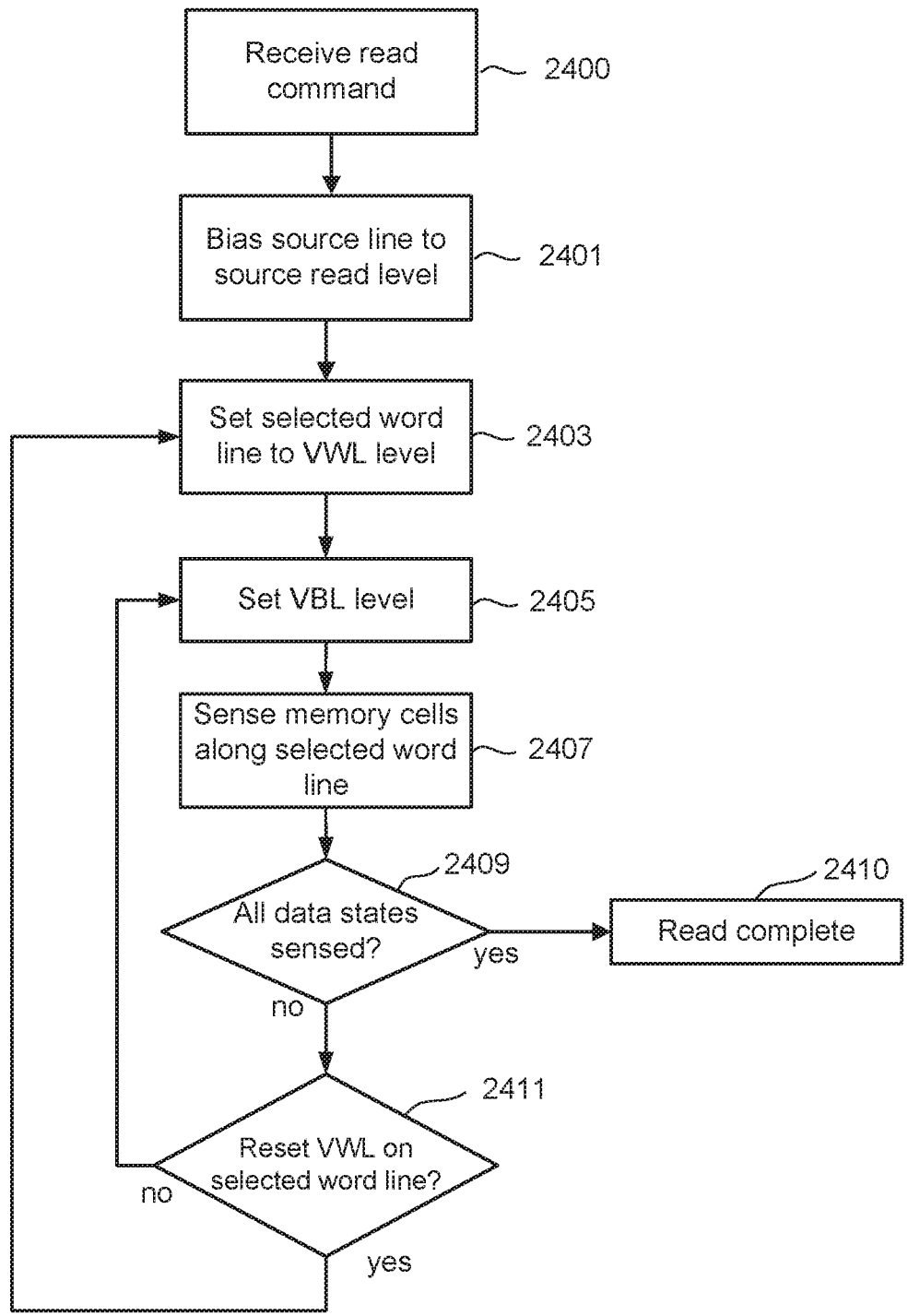
FIG. 24 is a flow chart describing one embodiment for a data read sense operation for memory cells that have been programmed using multi-state verify.

FIG. 24 is a flow chart describing one embodiment for a data read sense operation for memory cells that have been programmed using multi-state verify, illustrating one embodiment for reading all of the data states sequentially in order of increasing threshold values. For the 3-bit per cell embodiment that is used here as the main example, this corresponding to starting with an S1 read and working up to S7.

Beginning at step 2400, a memory die 108 receives a data read command from controller 122 to start the process. At step 2401, circuitry, such as the read/write circuits 128 of FIG. 1A, sets the bias level of the source line CELSRC 1803 is set to the voltage level for a sensing operation. At step 2403, reading circuitry, such as the read/write circuits 128 of FIG. 1A or the word line driver 2221 of FIG. 22, sets the voltage level VWL on word line 1802. For the primary example discussed above, where the pairs (S1, S2), (S3, S4), and (S5, S6) use the same VWL for sensing operations, this will initially be the VWL for sensing data state sS1 and S2. Steps 2401 and 2403 can correspond to step 1401 of FIG. 14, but where the specific VWL levels used here account for the ability of the sense amplifier of FIG. 18 to sense different data states with the same word line voltage by using different bit line voltages. At step 2405, the sense amplifier's bias control (e.g., 1131 or 1931) bias the bit lines to, in this example, either VBLH or VBLL based on the value of INV_E is low or high. For the initially sensing the data state S1, the bit line is biased to VBL_H. Step 2405 can correspond to step 1403 of FIG. 14, but again incorporating the selection of on VBL levels available from the sense amplifier. Although steps 2401, 2403, and 2405 are shown in a particular sequence, other sequences of these steps can be used and a typical implementation will often perform some or all of these steps concurrently.

Once the bias levels are set, the memory cells along the selected word line are sensed by the sense amplifier circuits, such as illustrated in FIG. 18, at step 2407. The sensing operation for the data read of step 2407 can be as in steps 1405-14017 of FIG. 14. During the sensing operation of step 2407, the memory cells in the first discharge phase and the SEN node in the second discharge phase will discharge from the SCOM node of FIG. 18 through either PMOS 1833 to SRCGND_H when INV_E is low or through NMOS 1831 to SRCGND_L when INV_E is high, based on the INV_E level corresponding to the state currently being sensed. For the data state S1 (and later the S3, S5, and S7 data states), INV_E is low, which also corresponds to the biasing the bit lines to the VBL_H level at step 2405. In later loops (for S2, S4, and S6, in the example used here), INV_E will be high, which also corresponds to the biasing of the bit lines to VBL_L level at step 2405.

After the sensing operation of step 2407, at step 2409 the on-chip control circuitry 110, including state machine 112, checks whether all of the data states have been sensed and, if so, the data read stops at step 2410; if not, at step 2411 the on-chip control circuitry 110, including state machine 112, can determine whether sensing for the next data state requires the word line voltage to be reset. If the VWL level needs to the stepped up, the flow loops back to step 2403. If the VWL level stays the same for the next state's sensing, the flow loops back to step 2405. For example, after sensing the data state S1, when looping back to sense data state S2, the word line level will stay at the same level, but the bit line level will be reset from VBL_H to VBL_L. After sensing S2, to sense the S3 data state the word line level will be raised to the level used for sensing S3 and S4 at step 2403 and at step 2405 the bit line level will be reset from VBL_L to VBL_H.

Considering the read process using the sense amplifier of FIG. 18 further, in a verify operation the memory system knows the target states to which the memory cells are to be programmed, allowing for the multi-state verify as a given memory only needs to checked for its target state. In the case of a data read, the data state of the memory cell will not be known beforehand, so that the data states need to be checked one at a time. For consistency in reading back the data, each of the data states can be sensed with the same bit line bias as used to verify that state. For the example described above, the data states S1, S3, S5, and S7 would be sensed using the VBLH level and data states S2, S4, and S6 would be verified using VBLL. Which bit line voltage is used in sensing will affect the distribution of the threshold voltages of the different states' distribution. In some embodiments, the verify voltage levels for some of the memory states can be shifted to account for this effect. FIGS. 25A-25D consider this effect and FIGS. 26A and 26B illustrate an embodiment with shifted verify levels for some of the data states to account for this effect.

Figure 25A:
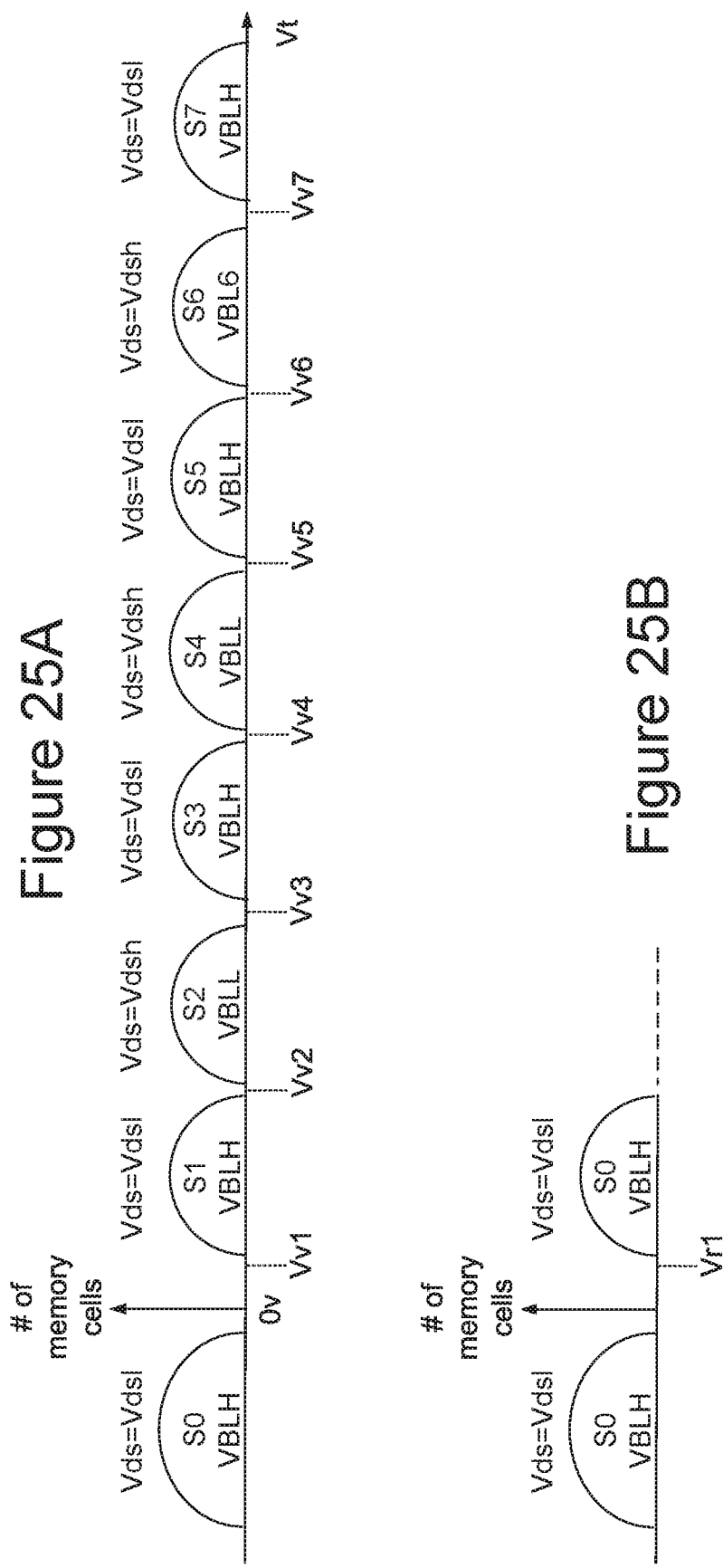
FIGS. 25A-25D consider the effect on the memory cells' threshold voltage distributions of using different bit line bias levels for sensing operations.
Figure 26A:
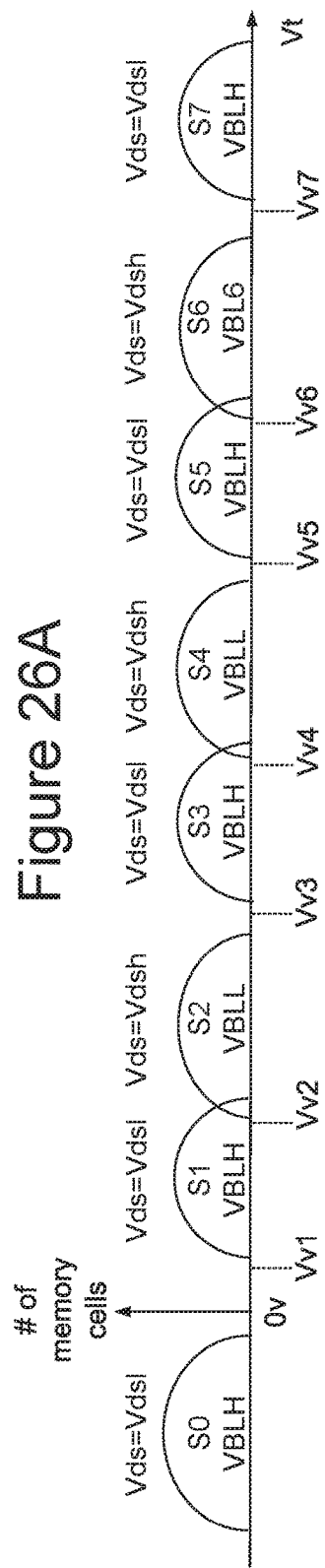
FIGS. 26A and 26B illustrate an embodiment with shifted verify levels for some of the data states to account for the effect illustrated by FIGS. 25A-25D.
Figure 26B:
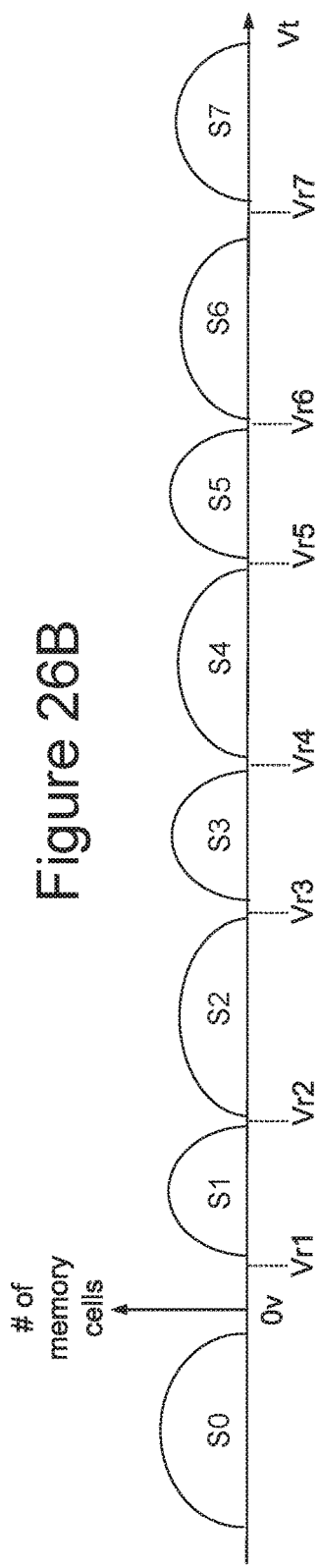

FIG. 25A looks at a conventional threshold distribution of memory cells for a 3 bit per cell embodiment, where only the data state S0 has a negative threshold voltage Vt, using evenly space verify voltages. FIG. 25A corresponds to FIG. 6, but where the memory cells' threshold voltages have been verify using a multi-state verify, where the bit lines level (VBLH or VBLL) used for the different data states are shown and, in this example, correspond to the embodiment as illustrated in FIGS. 17A-17C. As shown in FIG. 25A, the verify levels are evenly spaced, where, for example, the verify values can be taken Vv1=0.5, Vv2=1.0V, and so on in 0.5V steps if reference to specific values is needed. Also shown above distribution is the Vds across the memory cell during this verify operation, where the values shown are an example of one particular embodiment. In this example, when verifying data states S2, S4, and S6, the corresponding memory cells have a higher Vds value Vdsh, while the other states have a lower value of Vds value Vds1. For example, in one set of embodiments Vdsh can be, perhaps, 0.5V or a few tenths of a voltage higher and Vds1 can be a few tenths of a volt below Vdsh. With respect to the data state S0, or erased level, in the embodiment of this example data state S0 can be erased verify using the VBLH level corresponding to a Vds=Vds1.

Figure 25B:
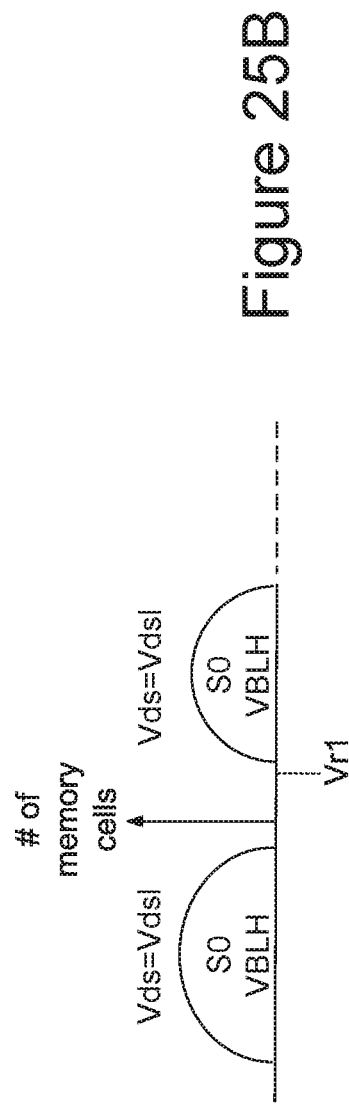

FIG. 25B considers a data read for the data state S1, where the read level of Vr1 is used to differentiate between the data states S1 and S0. In FIG. 25B, only the S0 and S1 distributions are shown. In a verify operation, both S0 and S1 use VBLH level and have a Vds=Vds1. In a data read for the S1 state, the VBLH level is applied to all of the bit lines of memory cells to be sensed, where as the data state of a given memory cell is not known ahead of time, this will include memory cells at both of the S0 and S1 distributions. As both of the data state S0 and the data state S1 were verified using the VBLH level and the VBLH level is again used to read for the data state S1, this will not affect the S0 and S1 distributions and these will not shift relative to the verify operation.

Figure 25C:
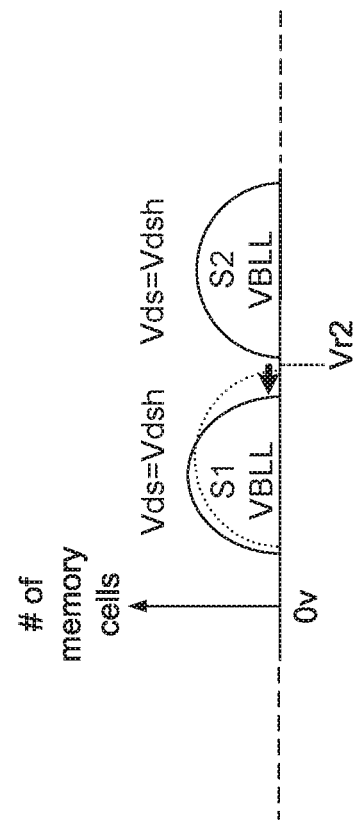

When reading the S2 data state using Vr2 to distinguish between the S1 and S2 data states using VBLL to bias the bit lines, as the S2 data state was verified using the VBLL. As data state S2 is read and verified using the same bias conditions, in both cases the memory cells have Vds=Vdsh and the S2 distribution does not move. For the data state S1, however, this state was verified using VBLH, corresponding to a Vds=Vds1; however, when sensing for a data read of the S2 data state the memory cells programmed to the data state S1 will also be biased using VBLH, leading to a Vds=Vdsh. This will cause the S1 data states to be more conductive, pushing down the data state S1 memory cell's threshold voltages, particularly at the higher end of the S1 distribution. FIG. 25C illustrates the resultant S1 and S2 distributions for these data states, leading a wider gap below the Vr2 level and the data state S1 distribution.

Figure 25D:
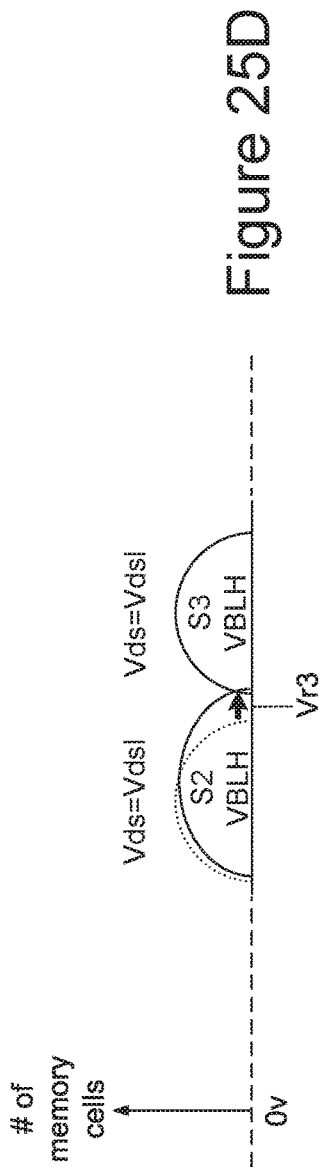

FIG. 25D looks at the data read for the S3 state using the Vr3 level to distinguish between the S2 and S3 data states. The S3 state was verified using the VBLH and is correspondingly read biasing the bit lines to VBLH. As S3 is read and verified using the same bias conditions, in both cases the memory cells have Vds=Vds1 and the S3 distribution does not move. For the data state S2, however, this state was verified using VBLL, corresponding to a Vds=Vdsh; but when sensing for a data read of the S3 state, the memory cells programmed to the S2 data state will also be biased using VBLH, leading to a Vds=Vds1. This will cause the S2 data state to be less conductive, pushing up the S2 memory cell's threshold voltages, particularly at the higher end of the S2 data state's distribution. FIG. 25D illustrates the resultant S2 and S3 distributions under these bias conditions, leading to the upper end of S2 distribution being above the Vr3 level, which lead some of the S2 data state memory cells reading as being in the S3 state.

The process described for the data reads of the data states S1, S2, and S3 also applies to the higher pairs of states concurrently verified. For the S1, S3, and S5 data states, the effective Vt shifts downward when respectively sensing the S2, S4, and S6 data states for a data read; and for the S2, S4, and S6 data states, the effective threshold shifts upward where sensing the next state up for a data read. Although a given verify pair (e.g., (S1, S2), (S3, S4) and (S5, S6) may occupy the same Vt "budget", or amount of space allotted for their distributions within the available threshold voltage window, their distributions within these windows shift between the multi-state verify operations and the subsequent data reads based on the same bias conditions. (As the S7 data state is unpaired in the embodiment of this example, it is unchanged). To account for the variation, in some embodiments, the sensing levels can be shifted.

FIGS. 26A and 26B illustrate one embodiment for shifting of the sensing levels to account for the Vt shifts described with respect to FIGS. 25A-25D. To account for the shift where sensing for a data read, the sensing levels for the verify operations can be shifted. As shown in FIG. 26A, relative to FIG. 25A the verify levels Vv1, Vv3, Vv5, and Vv7, corresponding to the VBLH states, are as before, but the verify levels Vv2, Vv4, and Vv6 are all shifted downward. This arrangement results in the upper tail of the S1, S3, and S5 distributions all respectively overlapping with the lower tail of the S2, S4, and S6 distributions. It also results in large gaps between the S2 and S3, S4 and S5, and the S6 and S7 distributions. Consequently, if these data states were read using the same bit line bias levels for all states, this could result in a significant amount of read error; however, as different VBL levels are used depending on which data state is being read, the phenomenon described with respect to FIGS. 25A-25D shifts these distributions.

FIG. 26B illustrates the effective distributions during a data read operation. As described with respect to FIGS. 25A-25D, the S1, S3, and S5 distributions are all compacted downward at the upper Vt end, while the S2, S4, and S6 distributions are all stretched upward at the upper Vt end. This results in different distributions acting as the well-separated distributions illustrated in FIG. 26B when sensed in a read operation, even though the uneven sensing levels lead to the uneven distribution of FIG. 26A as a result of the verify.

In other embodiments, rather than use either VBLH or VBLL in a read operation for a data state based on the level used during the verify for that state, a voltage level intermediate to VBLH and VBLL can be used for all of the data states. For example, rather than an embodiment such as illustrated with respect to FIG. 23B, an intermediate voltage level, such as VBL=(VBLH+VBLL)/2, can be used for all of data states S1-S7. This will also result in a Vds level intermediate to Vds1 and VdsH across the selected memory cell during a read operation for all of data states S1-S7. The sense amplifier circuit of FIGS. 18 and 19 can incorporate an additional path through the ZCOM node to provide this intermediate VBL level for the read operations. Under an embodiment using VBL=(VBLH+VBLL)/2 for read operations, the distributions for all of the data states S1-S8 can be of similar width, as illustrated in FIG. 6, as the difference between the VBL voltage for read and verify will be the same (namely (VBLH−VBLL)/2) for all data states.

Consequently, as described above, by incorporating multiple paths into a sense amplifier to bias bit lines to different bias levels, multiple target data states can be verified concurrently by discharging the source line through the memory cells being verified into the corresponding sense amplifiers. By using such a multi-state verify, the number of verify operations needed between the pulse of a write operation can be reduced, improving write performance. As the number of sensing operations in a program verify is reduced, this can also result in lowering power consumption.

According to a first set of aspects, an apparatus includes a word line, source line, a plurality of memory cells connected along the word line, and a plurality of bit lines. The apparatus also includes a plurality of sense amplifier circuits, each coupled to a corresponding one of the memory cells though one of the bit lines. The sense amplifier circuits are configured to concurrently: bias bit lines connected to a first set of the memory cells to a first voltage level; bias bit lines connected to a second set of the memory cells to a second voltage level; and discharge a source line voltage from the source line through each memory cell of the first set and second set to the corresponding sense amplifier circuit in response to a first, non-negative sensing voltage level applied to the word line.

In other aspects, a sense amplifier circuit comprises a first bias path configured to bias a selected memory cell connected to the sense amplifier circuit to a first voltage level and a second bias path configured to bias the selected memory cell to a second voltage level. Switching circuits are configured to sense the selected memory cell by selectively biasing the selected memory cell to one of the first voltage level and the second voltage level and, while the selected memory cell is selectively biased to one of the first voltage level and the second voltage level, discharging a current through the selected memory cell.

Other aspects include a method that includes applying a programming pulse to a word line connected to a plurality of memory cells and subsequently performing a verify. The verify includes biasing the word line to a first sensing voltage, and, while biasing the word line to the first sensing voltage, concurrently sensing a first set of a selected one or more of the memory cells for a first data state and a second set of a selected one or more of the memory cells for a second data state. Concurrently sensing a first set of a selected one or more of the memory cells for a first data state and a second set of a selected one or more of the memory cells for a second data state includes: for each of the memory cells of the first set, biasing a corresponding bit line to a first bit line voltage and measuring an amount of current through the memory cell from a source line to the corresponding bit line; and for each of the memory cells of the second set, biasing a corresponding bit line to a second bit line voltage and measuring an amount of current through the memory cell from the source line to the corresponding bit line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a word line;
   a source line;
   a plurality of memory cells connected along the word line;
   a plurality of bit lines; and
   a plurality of sense amplifier circuits each coupled to a corresponding one of the memory cells though one of the bit lines, the sense amplifier circuits configured to concurrently:
      bias bit lines connected to a first set of the memory cells to a first voltage level;
      bias bit lines connected to a second set of the memory cells to a second voltage level; and
      discharge a source line voltage from the source line through each memory cell of the first set and second set to the corresponding sense amplifier circuit in response to a first, non-negative sensing voltage level applied to the word line.

2. The apparatus of claim 1, further comprising:
   a control circuit configured to concurrently perform a first verify for a first data state and a second data state, including applying the first sensing voltage to the word line and the source line voltage to the source line while each of the first set and second set discharge the source line voltage to the corresponding sense amplifier circuit, wherein the first set are verified for the first data state and the second of memory cells are verified for the second data state.

3. The apparatus of claim 2, wherein:
   the control circuit is configured to concurrently perform a second verify for a third data state and a fourth data state, including applying a second sensing voltage to the word line and the source line voltage to the source line while each of a third set of memory cells and a fourth set of memory cells discharge the source line voltage to a corresponding sense amplifier circuit while bit lines connected to the third set of memory cells are biased at the first voltage level and bit lines connected to the third set of memory cells are biased and the second voltage level.

4. The apparatus of claim 2, wherein:
   the plurality of sense amplifier circuits are further configured to bias bit lines connected to a corresponding memory cell to a program inhibit voltage in response a memory cell of the first set verifying as programmed to the first data state or a memory cell of the second set verifying as programmed to the second data state.

5. The apparatus of claim 2, wherein:
   the control circuit is further configured to perform a read operation for the first data state and a read operation for the second data state, and
   the sense amplifier circuits are configured to bias the bit lines of a corresponding memory cell to the first voltage level for the read operation for the first data state and bias bit lines of a corresponding memory cell to the second voltage level for the read operation for the second data state.

6. The apparatus of claim 2, wherein:
the first data state corresponds to a negative threshold voltage state.

7. The apparatus of claim 2, wherein:
the control circuit is further configured to perform a read operation for the first data state and a read operation for the second data state, and
the sense amplifier circuits are configured to bias the bit lines of a corresponding memory cell to a voltage level intermediate to the first voltage level and the second voltage level for the read operation of both the first data state and the second data state.

8. The apparatus of claim 1, wherein:
the memory cells are part of a monolithic three-dimensional semiconductor memory device in which the memory cells are arranged in multiple physical levels above a substrate, comprise a charge storage medium, and word lines runs horizontally above the substrate.

9. A sense amplifier circuit, comprising:
a first bias path configured to bias a selected memory cell connected to the sense amplifier circuit to a first voltage level;
a second bias path configured to bias the selected memory cell to a second voltage level;
switching circuits configured to sense the selected memory cell by selectively biasing the selected memory cell to one of the first voltage level and the second voltage level and, while the selected memory cell is selectively biased to one of the first voltage level and the second voltage level, discharging a current through the selected memory cell; and
a third bias path configured to bias the selected memory cell to a program inhibit voltage, wherein the switching circuits are further configured to selectively bias the selected memory cell to the program inhibit voltage.

10. The sense amplifier circuit of claim 9, the sense amplifier circuit further comprising:
a discharge transistor through which the selected memory cell is discharged along a first discharge path to sense the selected memory cell.

11. The sense amplifier circuit of claim 10, further comprising:
a first bias supply transistor, through which the first voltage level is supplied to the first bias path, wherein the current through the selected memory cell is discharged through the first bias supply transistor when the selected memory cell is biased to the first voltage level; and
a second bias supply transistor, through which the second voltage level is supplied to the second bias path, wherein the current through the selected memory cell is discharged through the second bias supply transistor when the selected memory cell is biased to the second voltage level.

12. The sense amplifier circuit of claim 10, wherein:
the sense amplifier circuit is configured to sense the selected memory cell by setting a gate voltage on the discharge transistor by a voltage level on the first discharge path, subsequently cutting off the first discharge path while leaving the gate voltage on the discharge transistor to float at the voltage level, and discharging a sense node through the discharge transistor by a second discharge path.

13. The sense amplifier circuit of the claim 12, wherein the sense amplifier circuit is configured to sense a first data state for the selected memory cell by biasing the selected memory cell to the first voltage level while the current is discharged through the selected memory cell and to sense a second data state for the selected memory cell by biasing the selected memory cell to the second voltage level while the current is discharged through the selected memory cell.

14. The sense amplifier circuit of claim 9, wherein:
the selected memory cell is connected to the sense amplifier circuit through a bit line, the selected memory cell is connected between a source line and the bit line, and a biasing circuit sets the source line to a higher voltage than the bit line during a sensing operation.

15. The sense amplifier of claim 14, wherein:
a sensing operation for a negative threshold voltage state by applying a non-negative voltage to a control gate of the selected memory cell.

16. A method, comprising:
applying a programming pulse to a word line connected to a plurality of memory cells; and
subsequently performing a verify, comprising:
biasing the word line to a first sensing voltage; and
while biasing the word line to the first sensing voltage, concurrently sensing a first set of a selected one or more of the memory cells for a first data state and a second set of a selected one or more of the memory cells for a second data state, including:
for each of the memory cells of the first set, biasing a corresponding bit line to a first bit line voltage and measuring an amount of current through the memory cell from a source line to the corresponding bit line; and
for each of the memory cells of the second set, biasing a corresponding bit line to a second bit line voltage and measuring an amount of current through the memory cell from the source line to the corresponding bit line.

17. The method of claim 16, wherein measuring an amount of through the memory cell from a source line to the corresponding bit line comprises:
discharging the memory cell by a first discharge path through the corresponding bit line to a sense amplifier;
setting a voltage on a control gate of a discharge transistor to a voltage level along the first discharge path, the voltage level dependent on a data state of the memory cell; and
subsequently discharging a sense node through the discharge transistor with the control gate of the discharge transistor set to the voltage level dependent on the data state of the memory cell.

18. The method of claim 16, wherein the verify further includes:
biasing the word line to a second sensing voltage; and
while biasing the word line to the second sensing voltage, concurrently sensing a third set of a selected one or more of the memory cells for a third data state and a fourth set of a selected one or more of the memory cells for a fourth data state, including:
for each of the memory cells of the third set, biasing a corresponding bit line to a first bit line voltage and measuring an amount of current through the memory cell from a source line to the corresponding bit line; and
for each of the memory cells of the fourth set, biasing a corresponding bit line to a second bit line voltage and measuring an amount of current through the memory cell from the source line to the corresponding bit line.

19. The method of claim 16, wherein:

the first sensing voltage is a non-negative voltage; and one or both of the first and second data states correspond to a negative threshold voltage for the memory cells.

* * * * *